(12) United States Patent
Takashima et al.

(10) Patent No.: US 10,955,751 B2
(45) Date of Patent: Mar. 23, 2021

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Yuta Takashima, Oyama (JP); Yoshifumi Ueno, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/842,421

(22) Filed: Apr. 7, 2020

(65) Prior Publication Data

US 2020/0236769 A1     Jul. 23, 2020

Related U.S. Application Data

(63) Continuation of application No. PCT/JP2017/040442, filed on Nov. 9, 2017.

(51) Int. Cl.
*G03F 7/20* (2006.01)
*H05G 2/00* (2006.01)

(52) U.S. Cl.
CPC ...... *G03F 7/70033* (2013.01); *G03F 7/70041* (2013.01); *G03F 7/70533* (2013.01); *H05G 2/006* (2013.01); *H05G 2/008* (2013.01)

(58) Field of Classification Search
CPC . H05G 2/00–008; G03F 7/20; G03F 7/70033; G03F 7/70008; G03F 7/70025;

(Continued)

(56) References Cited

U.S. PATENT DOCUMENTS

| 8,158,960 B2 * | 4/2012 | Vaschenko | H05G 2/003 |
| | | | 250/504 R |
| 9,426,872 B1 * | 8/2016 | Riggs | H05G 2/008 |

(Continued)

FOREIGN PATENT DOCUMENTS

| JP | 2004-031342 A | 1/2004 |
| JP | 2006-216801 A | 8/2006 |

(Continued)

OTHER PUBLICATIONS

International Search Report issued in PCT/JP2017/040442; dated Feb. 6, 2018.

(Continued)

*Primary Examiner* — Christina A Riddle
(74) *Attorney, Agent, or Firm* — Studebaker & Brackett PC

(57) ABSTRACT

An extreme ultraviolet light generation apparatus that generates plasma by irradiating a target substance with a pulse laser beam and generates extreme ultraviolet light from the plasma includes: a droplet detection unit configured to detect a droplet passing through a predetermined position between a target supply unit and a plasma generation region; and a control unit configured to control a laser apparatus configured to output the pulse laser beam. The control unit performs control to determine whether there is a defective droplet based on a droplet detection signal obtained from the droplet detection unit and to stop, when it is determined that there is a defective droplet, irradiation of the defective droplet determined to be defective, a preceding droplet output one droplet before the defective droplet, and a following droplet output one droplet after the defective droplet with the pulse laser beam.

20 Claims, 17 Drawing Sheets

(58) Field of Classification Search
CPC ............... G03F 7/70041; G03F 7/7085; G03F 7/70483; G03F 7/70491; G03F 7/70508; G03F 7/70525; G03F 7/70533; G03F 7/70541; G03F 7/7055; G03F 7/70591
USPC .............. 355/30, 52–55, 67–71, 77; 430/30; 250/492.1, 492.2, 492.22, 493.1, 503.1, 250/504 R, 505.1; 378/34, 35; 315/111.01, 111.21; 313/231.01, 231.31
See application file for complete search history.

(56) References Cited

U.S. PATENT DOCUMENTS

| | | | |
|---|---|---|---|
| 10,670,970 B1 * | 6/2020 | Cheng | ............... G03F 1/58 |
| 2003/0223542 A1 | 12/2003 | Shields | |
| 2006/0176925 A1 | 8/2006 | Nakano | |
| 2012/0175533 A1 | 7/2012 | Moriya et al. | |
| 2012/0305811 A1 | 12/2012 | Wakabayashi et al. | |
| 2014/0353528 A1 | 12/2014 | Hayashi et al. | |
| 2019/0094717 A1 * | 3/2019 | Yang | ............... G03F 7/70033 |

FOREIGN PATENT DOCUMENTS

| | | |
|---|---|---|
| JP | 2008-532228 A | 8/2008 |
| JP | 2014-235805 A | 12/2014 |
| JP | 2016-096148 A | 5/2016 |
| JP | 2016-515755 A | 5/2016 |
| WO | 2006/093687 A1 | 9/2006 |
| WO | 2013/190944 A1 | 12/2013 |
| WO | 2014/161698 A1 | 10/2014 |

OTHER PUBLICATIONS

International Preliminary Report on Patentability and Written Opinion issued in PCT/JP2017/040442; dated May 12, 2020.

* cited by examiner

EXTREME ULTRAVIOLET LIGHT GENERATION APPARATUS AND ELECTRONIC DEVICE MANUFACTURING METHOD

CROSS-REFERENCE TO RELATED APPLICATIONS

The present application is a continuation application of International Application No. PCT/JP2017/040442, filed on Nov. 9, 2017, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation apparatus that generates extreme ultraviolet (EUV) light at a wavelength of 13 nm approximately in combination with reduced projection reflective optics.

Disclosed EUV light generation apparatuses include the three kinds of devices of a laser produced plasma (LPP) device that uses plasma generated by irradiating a target substance with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2014-235805
Patent Document 2: Japanese Unexamined Patent Application Publication No. 2004-31342

SUMMARY

An extreme ultraviolet light generation apparatus according to an aspect of the present disclosure generates plasma by irradiating a target substance with a pulse laser beam and generates extreme ultraviolet light from the plasma, and includes: a chamber housing a plasma generation region in which the pulse laser beam is incident; a target supply unit configured to sequentially supply droplets of the target substance to the plasma generation region in the chamber; a droplet detection unit configured to detect the droplets output from the target supply unit and passing through a predetermined position between the target supply unit and the plasma generation region; and a control unit configured to control a laser apparatus configured to output the pulse laser beam, the control unit being configured to perform control to determine whether there is a defective droplet based on a droplet detection signal obtained from the droplet detection unit and to stop, when it is determined that there is a defective droplet, irradiation of the defective droplet, a preceding droplet output one droplet before the defective droplet, and a following droplet output one droplet after the defective droplet with the pulse laser beam.

An extreme ultraviolet light generation apparatus according to another aspect of the present disclosure generates plasma by irradiating a target substance with a pulse laser beam and generates extreme ultraviolet light from the plasma, and includes: a chamber housing a plasma generation region in which the pulse laser beam is incident; a target supply unit configured to sequentially supply droplets of the target substance to the plasma generation region in the chamber; a droplet detection unit configured to detect the droplets output from the target supply unit and passing through a predetermined position between the target supply unit and the plasma generation region; and a control unit configured to control a laser apparatus configured to output the pulse laser beam, the control unit being configured to perform control to calculate an inter-droplet distance of the droplet based on a droplet detection signal obtained from the droplet detection unit and to stop, when the inter-droplet distance is shorter than a predetermined defined distance, irradiation of each of droplets adjacent to each other with the pulse laser beam at an inter-droplet distance shorter than the defined distance.

An extreme ultraviolet light generation apparatus according to another aspect of the present disclosure generates plasma by irradiating a target substance with a pulse laser beam and generates extreme ultraviolet light from the plasma, and includes: a chamber housing a plasma generation region in which the pulse laser beam is incident; a target supply unit configured to sequentially supply droplets of the target substance to the plasma generation region in the chamber; a droplet detection unit configured to detect the droplets output from the target supply unit and passing through a predetermined position between the target supply unit and the plasma generation region; and a control unit configured to control a laser apparatus configured to output the pulse laser beam, the control unit being configured to perform control to calculate a time interval of the droplets passing through the predetermined position based on a droplet detection signal obtained from the droplet detection unit and to stop, when the time interval of the droplets is shorter than a predetermined defined time, irradiation of each of droplets adjacent to each other at a time interval shorter than the defined time with the pulse laser beam.

BRIEF DESCRIPTION OF THE DRAWINGS

Embodiments of the present disclosure will be described below as examples with reference to the accompanying drawings.

DESCRIPTION OF EMBODIMENTS

Contents

1. Overall description of extreme ultraviolet light generation system
  1.1 Configuration
  1.2 Operation
2. Terms
3. Control of target supply unit and laser apparatus in EUV light generation system
  3.1 Configuration
  3.2 Operation
4. Control system of laser apparatus
  4.1 Configuration
  4.2 Operation
5. Satellite detection and light emission trigger control
6. Problem
7. Embodiment 1
  7.1 Configuration
  7.2 Operation
  7.3 Margin of delay time from droplet detection to laser irradiation
    7.3.1 Description of total delay time
    7.3.2 Description of margin time that control unit has
  7.4 Example 1 of laser beam irradiation control
    7.4.1 Operation
    7.4.2 Effect
    7.4.3 Modification 1
  7.5 Example 2 of laser beam irradiation control
    7.5.1 Operation
    7.5.2 Effect
    7.5.3 Modification 2
  7.6 Example 3 of laser beam irradiation control
    7.6.1 Operation
    7.6.2 Effect
  7.7 Timing chart illustrating exemplary laser beam irradiation timing control
8. Embodiment 2
  8.1 Configuration
  8.2 Operation
  8.3 Timing chart illustrating exemplary laser beam irradiation timing control
  8.4 Effect
9. Exemplary electronic device manufacturing method using EUV light generation apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation System

1.1 Configuration

Figure 1:
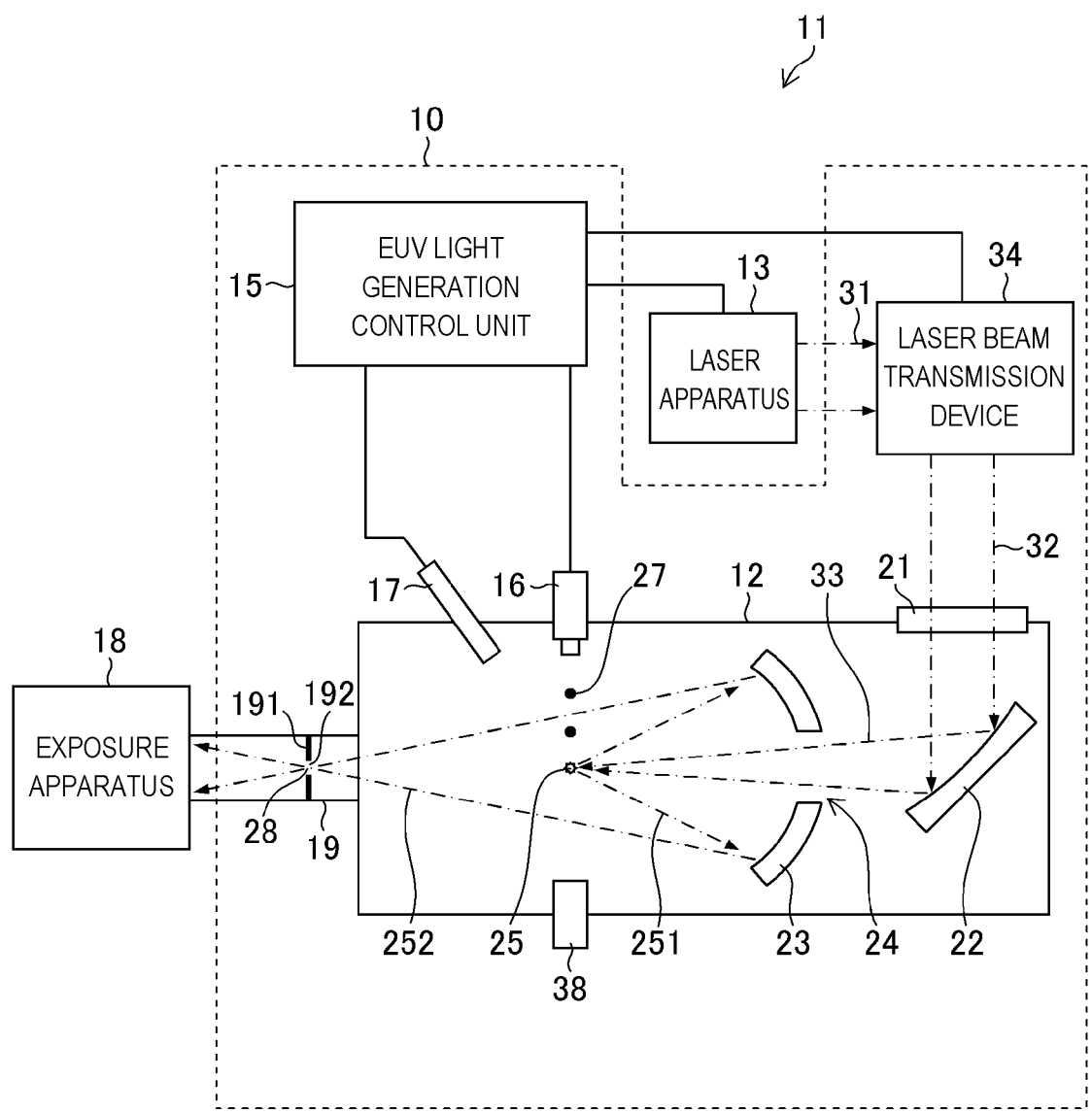
FIG. 1 is a diagram schematically illustrating the configuration of an exemplary LPP EUV light generation system.

FIG. 1 schematically illustrates the configuration of an exemplary LPP EUV light generation system. This EUV light generation apparatus 10 is used together with at least one laser apparatus 13 in some cases. In the present application, a system including the EUV light generation apparatus 10 and the laser apparatus 13 is referred to as an EUV light generation system 11. As illustrated in FIG. 1 and described below in detail, the EUV light generation apparatus 10 includes a chamber 12 and a target supply unit 16.

The chamber 12 is a sealable container. The target supply unit 16 supplies a target substance into the chamber 12 and is attached to, for example, penetrate through the wall of the chamber 12. The material of the target substance may contain tin, terbium, gadolinium, lithium, xenon, or a combination of two or more of these materials, but is not limited thereto.

The wall of the chamber 12 is provided with at least one through-hole. The through-hole is blocked by a window 21 through which a pulse laser beam 32 output from the laser apparatus 13 transmits. For example, an EUV condensation mirror 23 having a spheroidal reflective surface is disposed inside the chamber 12.

The EUV condensation mirror 23 has a first focal point and a second focal point. For example, a multi-layer reflective film obtained by alternately stacking molybdenum and silicon is formed on the surface of the EUV condensation mirror 23. The EUV condensation mirror 23 may be disposed so that, for example, the first focal point is positioned in a plasma generation region 25 and the second focal point is positioned at an intermediate focusing point (IF) 28. The EUV condensation mirror 23 is provided with a through-hole 24 at a central part, through which a pulse laser beam 33 passes.

The EUV light generation apparatus 10 includes an EUV light generation control unit 15, a target sensor 17 and the like. The target sensor 17 detects one or a plurality of the existence, locus, position, and speed of a target 27. The target sensor 17 may have an image capturing function.

The EUV light generation apparatus 10 also includes a connection unit 19 that provides communication between the inside of the chamber 12 and the inside of an exposure apparatus 18. The connection unit 19 includes a wall 191 through which an aperture 192 is formed. The wall 191 is disposed so that the aperture 192 is positioned at the second focal point of the EUV condensation mirror 23.

In addition, the EUV light generation apparatus 10 includes a laser beam transmission device 34, a laser beam condensation mirror 22, a target collection unit 38 for collecting the target 27 and the like. The laser beam transmission device 34 includes an optical element for defining the transmission state of a laser beam, and an actuator adjusting the position, posture, or the like of the optical element.

1.2 Operation

The following describes operation of the exemplary LPP EUV light generation system with reference to FIG. 1.

A pulse laser beam 31 output from the laser apparatus 13 passes through the laser beam transmission device 34 and is incident in the chamber 12 through the window 21 as the pulse laser beam 32. The pulse laser beam 32 travels along at least one laser beam path in the chamber 12 and is reflected by the laser beam condensation mirror 22 and incident on at least one target 27 as the pulse laser beam 33.

The target supply unit 16 outputs the target 27 made of the target substance toward the plasma generation region 25 in the chamber 12.

The target 27 is irradiated with at least one pulse included in the pulse laser beam 33. Plasma is generated from the target 27 irradiated with the pulse laser beam and radiates radiation light 251. EUV light 252 included in the radiation light 251 is selectively reflected by the EUV condensation mirror 23. The EUV light 252 reflected by the EUV condensation mirror 23 is condensed at the intermediate focusing point 28 and output to the exposure apparatus 18. One target 27 may be irradiated with a plurality of pulses included in the pulse laser beam 33.

The EUV light generation control unit 15 collectively controls the entire EUV light generation system 11. The EUV light generation control unit 15 processes a result of detection by the target sensor 17. The EUV light generation control unit 15 may control the output timing of the target 27, the output direction of the target 27, and the like based on the result of detection by the target sensor 17. In addition, the EUV light generation control unit 15 may control the oscillation timing of the laser apparatus 13, the traveling direction of the pulse laser beam 32, the condensation position of the pulse laser beam 33, and the like. These various kinds of control are merely exemplary, and may include other control as necessary.

2. Terms

"Target" is an object irradiated with a laser beam introduced into the chamber. When irradiated with the laser beam, the target generates plasma and radiates EUV light. The target is a plasma generation source.

"Droplet" is a form of a target supplied into the chamber. The droplet may mean the target deformed into a substantially spherical shape due to the surface tension of the melted target substance. In the specification and drawings, the droplet is also referred to as "DL" for simplification of description. In addition, for example, a droplet detection signal is also referred to as a DL detection signal, an inter-droplet distance is also referred to as an inter-DL distance, and a droplet time interval is also referred to as a DL time interval.

"Pulse laser beam" may be a laser beam including a plurality of pulses.

"Laser beam" is not limited to a pulse laser beam but may be a general laser beam.

"Laser beam path" is the optical path of a laser beam.

"Plasma light" is radiation light radiated from the target as plasma. This radiation light includes EUV light.

"EUV light" stands for "extreme ultraviolet light".

"Plasma generation region" may mean a region in which plasma generation is started for EUV light generation.

"Light emission trigger" is a signal that instructs laser beam emission to a laser apparatus configured to generate and emit (output) a laser beam. "Light emission trigger signal" may include the light emission trigger and change with time.

"Piezoelectric element" is synonymous with dielectric element. The piezoelectric element is also simply referred to as "piezoelectric".

3. Control of Target Supply Unit and Laser Apparatus in EUV Light Generation System

3.1 Configuration

Figure 2:
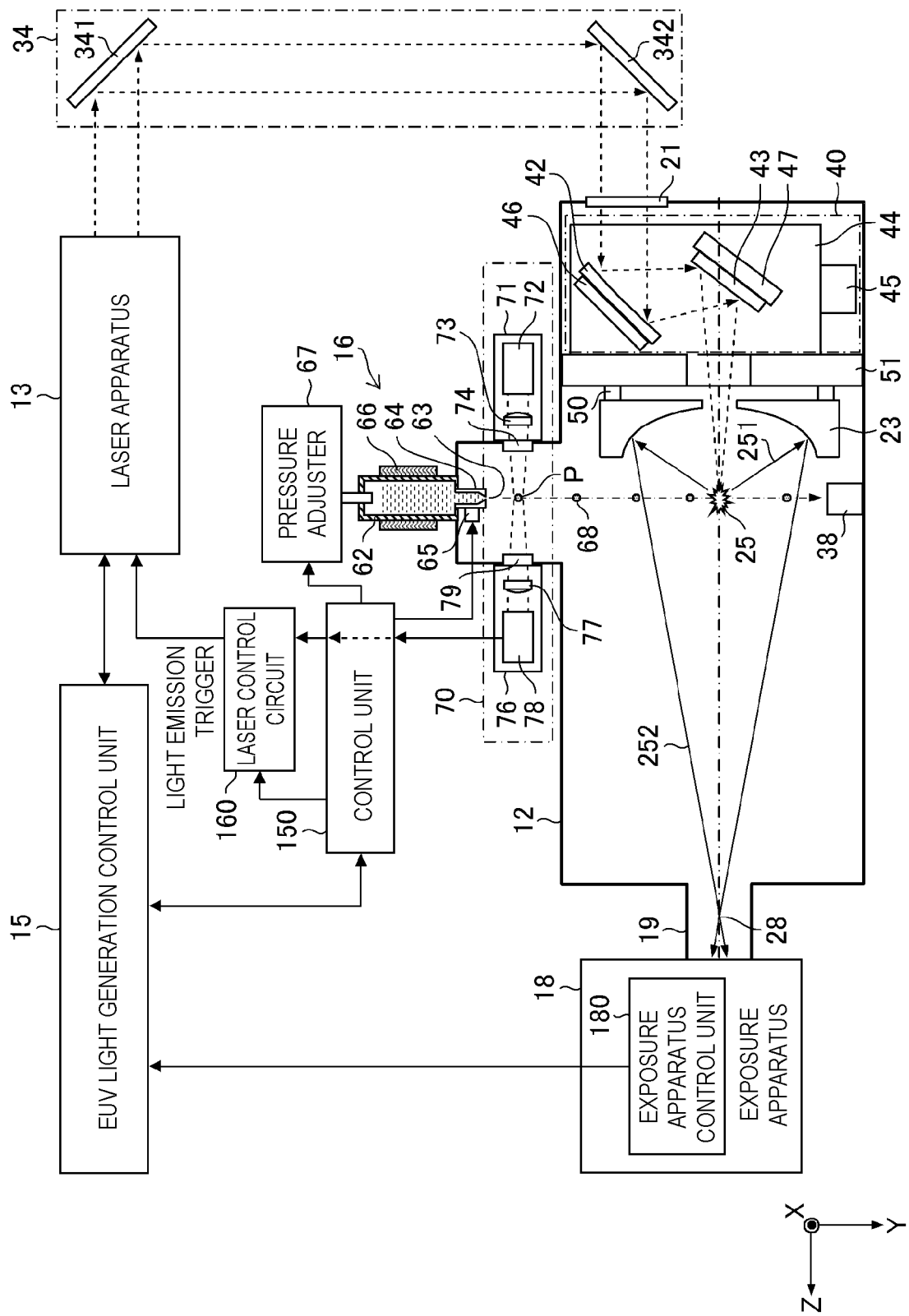
FIG. 2 is a partially cross-sectional view of an exemplary configuration of the EUV light generation system.

FIG. 2 illustrates a partially cross-sectional view of an exemplary configuration of the EUV light generation system. The EUV light generation apparatus 10 includes a control unit 150 and a laser control circuit 160. The laser control circuit 160 may be included in the control unit 150. At least one of the control unit 150 and the laser control circuit 160 may be included in the EUV light generation control unit 15.

The laser apparatus 13 may be a master oscillator power amplifier (MOPA) system. The laser apparatus 13 may include a master oscillator (not illustrated), an optical isolator (not illustrated), and a plurality of $CO_2$ laser amplifiers (not illustrated). The master oscillator is a laser oscillator configured to generate and output a pulse laser beam. The wavelength of the laser beam output from the master oscillator is, for example, 10.59 μm, and the repetition frequency of pulse oscillation may be, for example, 100 kHz.

The laser beam transmission device 34 includes a first high reflectance mirror 341 and a second high reflectance mirror 342 as optical elements for defining the traveling direction of a laser beam. The laser beam transmission device 34 forms a laser beam path through which a laser beam output from the laser apparatus 13 is guided to the window 21 of the chamber 12.

As illustrated in FIG. 2, the chamber 12 includes a laser condensation optical system 40, the EUV condensation mirror 23, an EUV condensation mirror holder 50, a first plate 51, and the target collection unit 38.

The first plate 51 is fixed to the inner wall of the chamber 12. The first plate 51 holds the laser condensation optical system 40 and the EUV condensation mirror holder 50. The EUV condensation mirror 23 is held by the EUV condensation mirror holder 50. The EUV condensation mirror holder 50 is fixed to the first plate 51.

The laser condensation optical system 40 condenses, to the plasma generation region 25, a laser beam incident in the chamber 12 through the window 21. The laser condensation optical system 40 may include an off-axis parabolic mirror 42, a planar mirror 43, a second plate 44, and a stage 45. The off-axis parabolic mirror 42 is held by a mirror holder 46. The mirror holder 46 is fixed to the second plate 44.

The planar mirror 43 is held by a mirror holder 47. The mirror holder 47 is fixed to the second plate 44. The second plate 44 is held by the first plate 51. The stage 45 may be capable of moving the second plate 44 in the directions of three axes orthogonal to each other. The positions and postures of these mirrors are maintained so that the pulse laser beam 33 reflected by the off-axis parabolic mirror 42 and the planar mirror 43 is condensed to the plasma generation region 25. The off-axis parabolic mirror 42 is an exemplary laser beam condensation mirror 22 described with reference to FIG. 1.

The chamber 12 also includes the target supply unit 16 and a droplet detection device 70. The target supply unit 16 includes a tank 62 in which the target substance is stored, a nozzle 64 having a nozzle hole 63 through which the target substance is output, a piezoelectric element 65 disposed at the nozzle 64, a heater 66 disposed at the tank 62, and a pressure adjuster 67.

The target supply unit 16 outputs a droplet 68 formed of the target substance toward the plasma generation region 25 inside the chamber 12.

The tank 62 may be formed in a hollow tubular shape. The target substance is housed inside the hollow tank 62. At least the inside of the tank 62 is made of a material unlikely to react with the target substance. Examples of materials unlikely to react with tin as an exemplary target substance include SiC, $SiO_2$, $Al_2O_3$, molybdenum, tungsten, and tantalum.

The heater 66 is fixed to an outer side surface part of the tank 62. The heater 66 heats the tank 62.

The pressure adjuster 67 includes an electromagnetic valve (not illustrated), a pressure sensor (not illustrated) for gas supply and discharge and the like. The pressure adjuster 67 can detect the pressure in the tank 62 by using the pressure sensor. The pressure adjuster 67 can discharge gas in the tank 62 by operating a discharge pump (not illustrated). The pressure adjuster 67 is connected with the control unit 150. The pressure adjuster 67 outputs a detection signal of the detected pressure to the control unit 150. The control unit 150 supplies, to the pressure adjuster 67, a control signal for controlling the operation of the pressure adjuster 67 based on the detection signal output from the pressure adjuster 67 so that the pressure in the tank 62 becomes equal to a target pressure.

The pressure adjuster 67 can increase or decrease the pressure in the tank 62 by supplying gas into the tank 62 or discharging gas in the tank 62 based on the control signal from the control unit 150. The pressure in the tank 62 is adjusted to the target pressure by the pressure adjuster 67.

The nozzle 64 is provided at a bottom surface part of the tubular tank 62. One end of the nozzle 64 having a pipe shape is fixed to the hollow tank 62. The nozzle hole 63 is provided at the other end of the nozzle 64 having the pipe shape. The tank 62 on the one end side of the nozzle 64 is positioned outside the chamber 12, and the nozzle hole 63 on the other end side of the nozzle 64 is positioned inside the chamber 12. The insides of the tank 62, the nozzle 64, and the chamber 12 communicate with each other.

The plasma generation region 25 inside the chamber 12 is positioned on an extended line of the central axis direction of the nozzle 64. In FIG. 2, for the purpose of illustration, a three-dimensional XYZ orthogonal coordinate system is introduced, and a Y axial direction is defined to be along the central axis direction of the nozzle 64. A Z axial direction is defined to be a direction in which EUV light is guided from the chamber 12 toward the exposure apparatus 18, and an X axial direction is defined to be a direction orthogonal to the sheet of FIG. 2.

The nozzle hole 63 is formed in such a shape that the target substance being melted is ejected into the chamber 12 in a jet form. The target substance output from the nozzle hole 63 may be, for example, liquid tin.

The target supply unit 16 forms the droplet 68 by, for example, a continuous jet scheme. In the continuous jet scheme, the nozzle 64 is vibrated to provide periodic vibration (typically, sine wave) to flow of the target ejected in a jet form, thereby periodically separating the target. The separated target may form a free interface by the own surface tension, thereby forming the droplet 68.

The piezoelectric element 65 may be a component of a droplet formation mechanism configured to provide vibration necessary for forming the droplet 68 to the nozzle 64. The piezoelectric element 65 is fixed to an outer side surface part of the nozzle 64.

The droplet detection device 70 detects one or a plurality of the existence, locus, position, and speed of the droplet 68 output into the chamber 12. The droplet detection device 70 is an exemplary target sensor 17 described with reference to FIG. 1.

The droplet detection device 70 includes a light source unit 71 and a light receiving unit 76. The light source unit 71 includes a light source 72 and an illumination optical system 73. The light source unit 71 is disposed to illuminate the droplet 68 at a predetermined position P on a droplet trajectory between the nozzle 64 of the target supply unit 16 and the plasma generation region 25.

The light source 72 may be a laser beam source of single-color light or a lamp configured to emit light in a plurality of wavelengths. For example, the light source 72 may be a continuous-wave (CW) laser beam source. The light source 72 may include an optical fiber connected with the illumination optical system 73. The illumination optical system 73 includes a light condensation lens.

The wall of the chamber 12 is provided with a window 74 that transmits light emitted by the light source 72. The window 74 may be a component of the illumination optical system 73. The beam diameter of a continuous laser beam with which the droplet 68 is irradiated may be sufficiently larger than the diameter of the droplet 68. The diameter of the droplet 68 is, for example, 20 μm.

The light receiving unit 76 includes a light receiving optical system 77 and an optical sensor 78. The light receiving unit 76 is disposed to receive illumination light output from the light source unit 71. The light receiving optical system 77 includes a lens through which an image of illumination light from the light source 72 at the predetermined position P is transferred onto elements of the optical sensor 78. The wall of the chamber 12 is provided with a window 79 that transmits light emitted by the light source 72. The window 79 may be a component of the light receiving optical system 77.

The optical sensor 78 is a light receiving element including one or a plurality of light receiving surfaces. The optical sensor 78 may be configured by any of a photodiode, a photodiode array, an avalanche photodiode, a photomultiplier, a multi-pixel photon counter, an image sensor such as a charge-coupled device (CCD) camera, and an image intensifier. The optical sensor 78 outputs an electric signal in accordance with received light intensity.

The light source unit 71 and the light receiving unit 76 may be disposed opposite to each other with a droplet trajectory, which is the traveling path of the droplet 68 as a target output into the chamber 12, interposed therebetween. The direction in which the light source unit 71 and the light receiving unit 76 are disposed opposite to each other may be orthogonal or non-orthogonal to the droplet trajectory.

The chamber 12 is also provided with an exhaust device (not illustrated) and a pressure sensor (not illustrated), and connected with a gas supply device (not illustrated).

The control unit 150 is connected with each of the EUV light generation control unit 15, the target supply unit 16, and the droplet detection device 70. The control unit 150 is also connected with the laser apparatus 13 through the laser control circuit 160. In addition, the control unit 150 is connected with an exhaust device, a pressure sensor, and a gas supply control valve (not illustrated). The control unit 150 controls the operation of the target supply unit 16 in accordance with a command from the EUV light generation control unit 15. The EUV light generation control unit 15 controls, for example, the output period of the droplet 68 and the speed of the droplet 68 based on a result of detection by the droplet detection device 70. In addition, the control unit 150 controls the output timing of the pulse laser beam 31 from the laser apparatus 13 based on a detection signal from the droplet detection device 70.

The exposure apparatus 18 includes an exposure apparatus control unit 180 connected with the EUV light generation control unit 15. The EUV light generation control unit 15 may receive an EUV light generation signal from the exposure apparatus control unit 180. The EUV light generation signal may instruct the EUV light generation system 11 to generate EUV light in a predetermined time. The EUV light generation control unit 15 may perform control operation for outputting EUV light to the exposure apparatus 18 during the predetermined time.

In the present disclosure, a control device such as the EUV light generation control unit 15, the control unit 150, or the exposure apparatus control unit 180 may be achieved by hardware and software combination of one or a plurality of computers. The software is synonymous with a computer program. The computers conceptually include a programmable controller. Part or all of processing functions necessary for control performed by the EUV light generation control unit 15, the control unit 150, or another control device may be achieved by using an integrated circuit such as a field programmable gate array (FPGA) or an application specific integrated circuit (ASIC).

Functions of a plurality of control devices may be achieved by one control device. In addition, in the present disclosure, the EUV light generation control unit 15, the control unit 150, the exposure apparatus control unit 180, and the like may be connected with each other through a communication network such as a local area network or the Internet. In a distributed computing environment, a computer program unit may be stored in local and remote memory storage devices.

Figure 3:
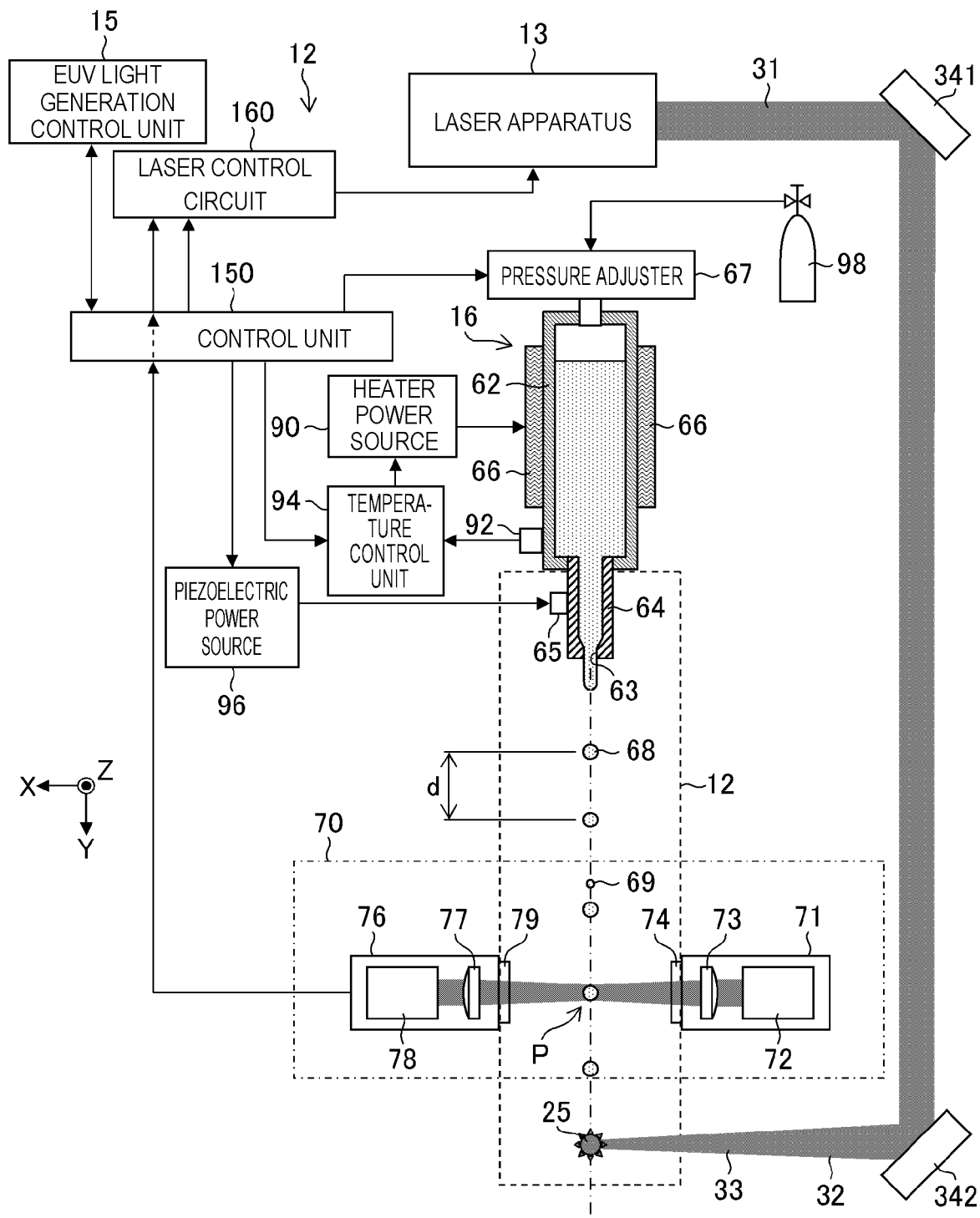
FIG. 3 is a diagram illustrating an overview of a control system configured to perform control of a target supply unit and control of a laser apparatus.

FIG. 3 is a diagram illustrating an overview of a control system configured to perform control of the target supply unit and control of the laser apparatus. As illustrated in FIG. 3, the EUV light generation apparatus 10 may include a heater power source 90, a temperature sensor 92, a temperature control unit 94, a piezoelectric power source 96, and an inert gas supply unit 98.

The heater power source 90 supplies electrical power to the heater 66. The heater power source 90 is connected with the temperature control unit 94. The temperature control unit 94 may be connected with the control unit 150 and may be included in the control unit 150. The electrical power supply from the heater power source 90 to the heater 66 is controlled by the temperature control unit 94.

The temperature sensor 92 is fixed to an outer side surface part of the tank 62. The temperature sensor 92 is connected with the temperature control unit 94. The temperature sensor 92 detects the temperature of the tank 62 and outputs a detection signal to the temperature control unit 94. The temperature control unit 94 may adjust electrical power supplied to the heater 66 based on the detection signal output from the temperature sensor 92.

The pressure adjuster 67 is disposed at a pipe between the inert gas supply unit 98 and the tank 62. The inert gas supply unit 98 may include a gas tank filled with inert gas such as helium or argon. The inert gas supply unit 98 may supply inert gas into the tank 62 through the pressure adjuster 67.

The piezoelectric element 65 is connected with the piezoelectric power source 96. The piezoelectric power source 96 supplies electrical power to the piezoelectric element 65. The piezoelectric power source 96 is connected with the control unit 150, and the electrical power supply to the piezoelectric element 65 is controlled by the control unit 150.

3.2 Operation

The control unit 150 controls the heater 66 based on a detected value of the temperature sensor 92. For example, when tin is used as the target substance, the control unit 150 controls the heater 66 so that tin in the tank 62 has a predetermined temperature equal to or higher than the melting point. As a result, tin in the tank 62 may melt. The melting point of tin is 232° C. The predetermined temperature may be, for example, 250° C. to 300° C.

The control unit 150 controls the pressure in the tank 62 through the pressure adjuster 67. The pressure adjuster 67 adjusts the pressure in the tank 62 under control of the control unit 150 so that the droplet 68 arrives at the plasma generation region 25 at a predetermined speed.

The control unit 150 transfers an electric signal having a predetermined frequency to the piezoelectric element 65 through the piezoelectric power source 96. The piezoelectric element 65 vibrates based on the electric signal from the piezoelectric power source 96, thereby vibrating the nozzle 64 at the predetermined frequency. As a result, liquid Sn is output in a jet form from the nozzle hole 63, and the droplet 68 is generated in accordance with the vibration of the nozzle hole 63 by the piezoelectric element 65. The target supply unit 16 can sequentially supply a plurality of droplets 68 at a predetermined speed and a predetermined distance interval d to the plasma generation region 25. The control unit 150 can calculate the time interval between the droplets 68 by using information of the speed of the droplets 68 and the distance interval d between the droplets 68.

Illumination light output from the light source unit 71 is received by the light receiving unit 76. When each droplet 68 passes through the predetermined position P on the droplet trajectory between the nozzle hole 63 and the plasma generation region 25, the intensity of light received by the light receiving unit 76 decreases in synchronization with the passing. This change in the light intensity is detected by the optical sensor 78 of the light receiving unit 76 and input as a droplet detection signal from the optical sensor 78 to the control unit 150. The predetermined position P on the droplet trajectory is also referred to as a "droplet detection position".

The droplet detection signal output from the light receiving unit 76 is transferred to the control unit 150. The control unit 150 may generate a pass timing signal indicating a droplet pass timing from the droplet detection signal. For example, the control unit 150 may generate the pass timing signal at High level in a duration in which the light intensity received by the optical sensor 78 is equal to or lower than a predetermined threshold. The pass timing signal is input from the control unit 150 to the laser control circuit 160. The pass timing signal may be generated at the droplet detection device 70. Specifically, the droplet detection device 70 may output a pass timing signal SA in synchronization with the pass timing of the droplet 68 and may input the pass timing signal SA to the control unit 150.

The laser control circuit 160 includes a delay circuit, generates a light emission trigger by adding a delay time to the pass timing signal SA, and inputs the light emission trigger to the laser apparatus 13. The delay time of the delay circuit is set so that the light emission trigger is input to the laser apparatus 13 before the droplet 68 passes through the predetermined position P and arrives at the plasma generation region 25. In other words, the delay time is set so that, when the droplet 68 arrives at the plasma generation region 25, the droplet 68 is irradiated with the pulse laser beam output from the laser apparatus 13.

The laser control circuit 160 may input the light emission trigger delayed from the pass timing signal by a predetermined time to the laser apparatus 13.

When the light emission trigger is input to the laser apparatus 13, the pulse laser beam 31 is output from the laser apparatus 13. The laser beam output from the laser apparatus 13 is guided to the plasma generation region 25 through the laser beam transmission device 34, the window 21, and the laser condensation optical system 40, and condensed and irradiated on the droplet 68 having arrived at the plasma generation region 25.

The target supply unit 16 can also generate a connection defective droplet such as a satellite 69 other than the droplet 68 normally connected in a necessary volume.

4. Control System of Laser Apparatus

4.1 Configuration

Figure 4:
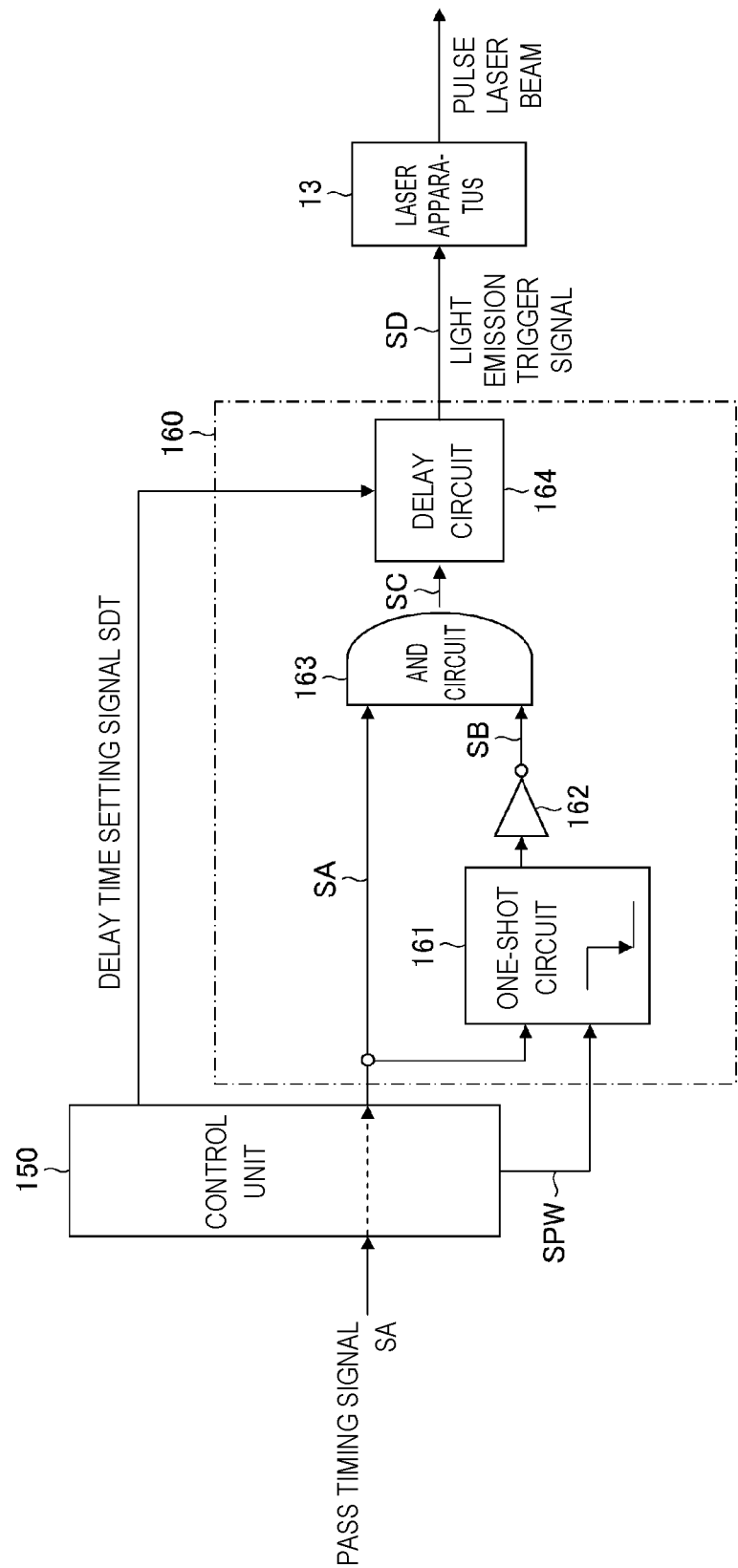
FIG. 4 is a block diagram schematically illustrating an exemplary configuration of the control system configured to control the laser apparatus.

FIG. 4 schematically illustrates an exemplary configuration of the control system configured to control the laser apparatus. The control system exemplarily illustrated in FIG. 4 includes the control unit 150 and the laser control circuit 160.

The laser control circuit 160 may include a one-shot circuit 161, an inverter 162, an AND circuit 163, and a delay circuit 164. The laser control circuit 160 generates a light emission trigger signal SD and outputs the light emission trigger signal SD to the laser apparatus 13.

The control unit 150 controls generation of the light emission trigger signal SD. The control unit 150 sets a pulse width Tsh of the one-shot circuit 161 through a pulse width setting signal SPW. The control unit 150 sets a delay time td of the delay circuit 164 through a delay time setting signal SDT.

The control unit 150 may receive the pass timing signal SA from the droplet detection device 70. The control unit 150 supplies, to the laser control circuit 160, the pass timing signal SA from the droplet detection device 70. Alternatively, the laser control circuit 160 may directly receive the pass timing signal SA, not from the control unit 150.

The input of the one-shot circuit 161 is connected with the output of the control unit 150. The one-shot circuit 161 receives the pass timing signal SA from the control unit 150. The one-shot circuit 161 outputs a pulse signal having the pulse width Tsh in response to the fall edge of the input signal. The input of the inverter 162 is connected with the output of the one-shot circuit 161.

One input of the AND circuit 163 is connected with the output of the inverter 162. The other input of the AND circuit 163 is connected with the output of the control unit 150. The AND circuit 163 receives the pass timing signal SA from the control unit 150. The input of the delay circuit 164 is connected with the output of the AND circuit 163. The delay circuit 164 outputs the light emission trigger signal SD to the laser apparatus 13.

4.2 Operation

When having received a droplet generation signal from the EUV light generation control unit 15, the control unit 150 transmits data of the delay time td to the delay circuit 164 and data of a one-shot pulse width Tw to the one-shot circuit 161.

In addition, the control unit 150 may receive the pass timing signal SA from the droplet detection device 70 and input the pass timing signal SA to the one-shot circuit 161 and the AND circuit 163. For example, the one-shot circuit 161 outputs a pulse having the pulse width Tsh at the fall edge of the pass timing signal SA. Specifically, the one-shot circuit 161 detects a timing at which change occurs from the state of ON with the pass timing signal SA at High level to the state of OFF with the pass timing signal SA at Low level, and generates a pulse indicating the detected timing.

The inverter 162 receives an output signal from the one-shot circuit 161 and generates an output signal obtained by inverting the received signal. The output signal from the inverter 162 is referred to as an inverter output signal SB. The inverter output signal SB is input to the AND circuit 163.

The AND circuit 163 receives the pass timing signal SA and the inverter output signal SB. The AND circuit 163 generates an AND signal of the pass timing signal SA and the inverter output signal SB thus received. The AND signal output from the AND circuit 163 is referred to as an AND circuit output signal SC. The AND circuit output signal SC is ON when the two input signals of the pass timing signal SA and the inverter output signal SB are both ON, or is OFF when at least one of the signals is OFF.

When the pass timing signal SA is input in the pulse width Tsh of the output pulse from the one-shot circuit 161, the pass timing signal SA is not output from the AND circuit 163. When the pass timing signal SA is input behind the pulse width Tsh of the output pulse from the one-shot circuit 161, the pass timing signal SA is output from the AND circuit 163.

The AND circuit 163 outputs the AND circuit output signal SC to the delay circuit 164. The delay circuit 164 generates the light emission trigger signal SD in accordance with the AND circuit output signal SC and outputs the light emission trigger signal SD to the laser apparatus 13. The delay circuit 164 outputs the light emission trigger signal SD generated behind the received AND circuit output signal SC by the delay time td.

The light emission trigger signal SD may be obtained by providing the defined delay time td to the AND circuit output signal SC. The delay time td may be such a delay time that the pulse laser beam is condensed to the plasma generation region 25 at a timing when the droplet 68 detected by the droplet detection device 70 arrives at the plasma generation region 25.

The delay time td is given by, for example, an expression below.

$$td=L/V-\alpha$$

In the expression, L represents the distance between the droplet detection position and the center of the plasma generation region 25, V represents the speed of the droplet 68, and $\alpha$ represents a required time until the pulse laser beam is condensed to the plasma generation region 25 after the light emission trigger instructing the laser apparatus 13 to emit the pulse laser beam is output.

The laser apparatus 13 may receive the light emission trigger signal SD from the delay circuit 164. The laser apparatus 13 may output the pulse laser beam in accordance with the light emission trigger signal SD. The laser apparatus 13 may output the pulse laser beam, for example, in response to the fall edge of a pulse in the light emission trigger signal SD. The pulse in the light emission trigger signal may be a light emission trigger instructing the master oscillator to emit (output) the pulse laser beam.

Figure 5:
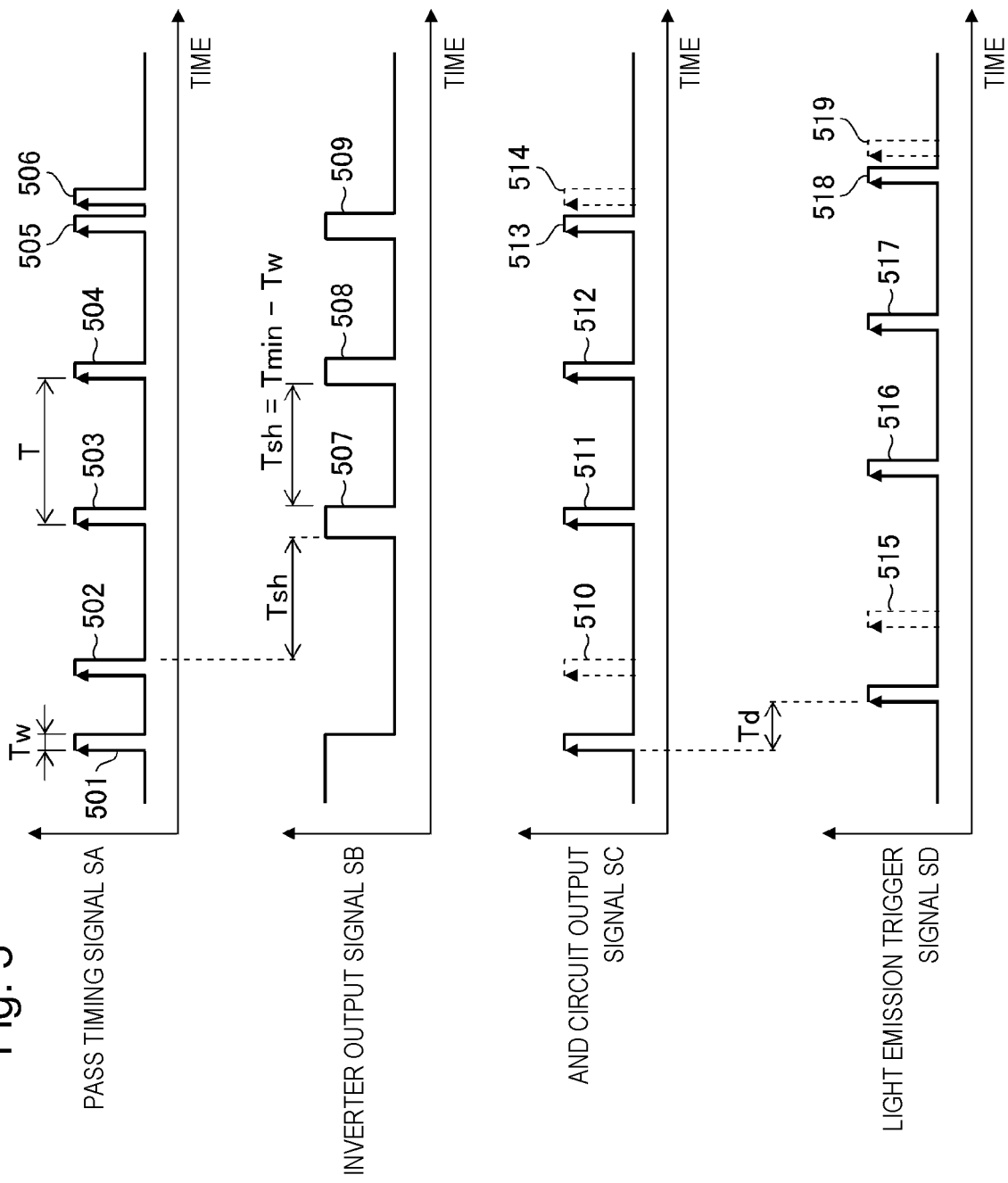
FIG. 5 illustrates an exemplary timing chart of signals in a laser control circuit.

FIG. 5 illustrates an exemplary timing chart of signals in the laser control circuit 160. This exemplary timing chart illustrates the relation among signals in the laser control circuit 160. Specifically, FIG. 5 illustrates a timing chart of the pass timing signal SA, the inverter output signal SB, the AND circuit output signal SC, and the light emission trigger signal SD.

In the pass timing signal SA, detection pulses 501 to 506 may be detection signals indicating droplet pass timings. The detection pulses 501 and 503 to 505 may be each generated upon detection of a desired droplet 68 normally connected. The detection pulses 502 and 506 may be each generated upon detection of a connection defective droplet different from the desired droplet 68. For example, the detection pulse 502 may be generated upon detection of a droplet output too early, and the detection pulse 506 may be generated upon detection of a satellite.

When the droplets 68 are supplied normally, a time interval T between detection pulses in the pass timing signal SA is in an allowable range. Specifically, Tmin≤T≤Tmax holds. The pulses as light emission triggers in the light emission trigger signal SD may be generated in a period same as that of the detection pulses in the pass timing signal SA.

Tmin may represent a minimum allowable value of the time interval between light emission triggers. Tmax may represent a maximum allowable value of the time interval between light emission triggers.

As described above, the time interval T between detection pulses in the pass timing signal SA can be shorter than Tmin or longer than Tmax due to a droplet generation defect. In FIG. 5, the time interval T between the detection pulse 501 and the detection pulse 502 can be shorter than Tmin. Similarly, the time interval T between the detection pulse 505 and the detection pulse 506 can be shorter than Tmin. The laser control circuit 160 can generate the light emission trigger signal SD so that the output interval of the light emission trigger does not become shorter than Tmin.

The detection pulse 501 of the pass timing signal SA has the pulse width Tw. Tw represents the pulse width of a pulse generated upon detection of each normally generated droplet 68. The output signal from the one-shot circuit 161 changes from OFF to ON at the fall edge of the detection pulse 501. The inverter output signal SB is an inversion signal of the output signal from the one-shot circuit 161. The inverter output signal SB changes from ON to OFF at the fall edge of the detection pulse 501.

The fall edge of the detection pulse 502 of the pass timing signal SA occurs while the inverter output signal SB is OFF. When having detected the fall edge of the input signal, the one-shot circuit 161 resets a count value of the pulse width Tsh. Thus, the pulse width Tsh of the output signal from the one-shot circuit 161 is a time from the fall edge of the pass timing signal SA as an immediately preceding input signal.

For example, the following relation may hold among Tsh, Tmin, and Tw: Tsh=Tmin−Tw. The pulse width Tsh may be a value set by a designer in advance. The designer may determine Tmin and Tw in accordance with a system configuration and determine Tsh from these values.

When the time Tsh has elapsed since the fall edge of the detection pulse 502, the output signal from the one-shot circuit 161 changes from ON to OFF. In other words, when the time Tsh has elapsed since the fall edge of the detection pulse 502, the inverter output signal SB changes from OFF to ON. The time from the fall edge of the detection pulse 502 to the rise edge of a pulse 507 of the inverter output signal SB may be Tsh.

The AND circuit output signal SC is ON when the inverter output signal SB and the pass timing signal SA are both ON. Thus, a pulse 510 corresponding to the detection pulse 502 may not be generated. Similarly, a light emission trigger pulse 515 of the light emission trigger signal, which corresponds to the pulse 510 of the AND circuit output signal SC, may not be generated.

The detection pulse 503 of the pass timing signal SA may be output while the inverter output signal SB is ON. Thus, a pulse 511 of the AND circuit output signal SC may be generated from the detection pulse 503.

A light emission trigger pulse 516 of the light emission trigger signal SD may be generated from the pulse 511 of the AND circuit output signal SC. The light emission trigger pulse 516 is delayed from the pulse 511 of the AND circuit output signal SC by the delay time td by a delay circuit 564.

When Tsh has elapsed since the fall edge of the pulse 507, the inverter output signal SB changes from OFF to ON. The time from the fall edge of the pulse 507 to the rise edge of a pulse 508 of the inverter output signal SB is Tsh. The inverter output signal SB changes from ON to OFF at the fall edge of the pulse 504 of the pass timing signal SA, thereby forming the fall edge of the pulse 508.

The pulse 504 of the pass timing signal SA may be output while the inverter output signal SB is ON. Thus, a pulse 512 of the AND circuit output signal SC may be generated from the pulse 504.

A light emission trigger pulse 517 of the light emission trigger signal SD is generated from the pulse 512 of the AND circuit output signal SC. The light emission trigger pulse 517 is delayed from the pulse 512 of the AND circuit output signal SC by the delay time td by the delay circuit 564.

The relation among pulses 505, 509, 513 and 518 is same as the relation among pulses 504, 508, 512 and 517. The relation among the pulse 506, a non-existing pulse 514, and a non-existing pulse 519 is same as the relation among the pulse 502, the non-existing pulse 510, and the non-existing pulse 515.

With the above-described configuration, outputting of pulses of the light emission trigger can be prevented when the time interval T between pulses of the pass timing signal SA upon detection of droplet passing is shorter than the minimum allowable value Tmin. As a result, decrease of the pulse energy of the pulse laser beam output from the laser apparatus 13 and change of the pulse width thereof can be prevented. Accordingly, variation of the pulse energy of EUV light and damage on the laser apparatus 13 can be prevented.

5. Satellite Detection and Light Emission Trigger Control

Figure 6:
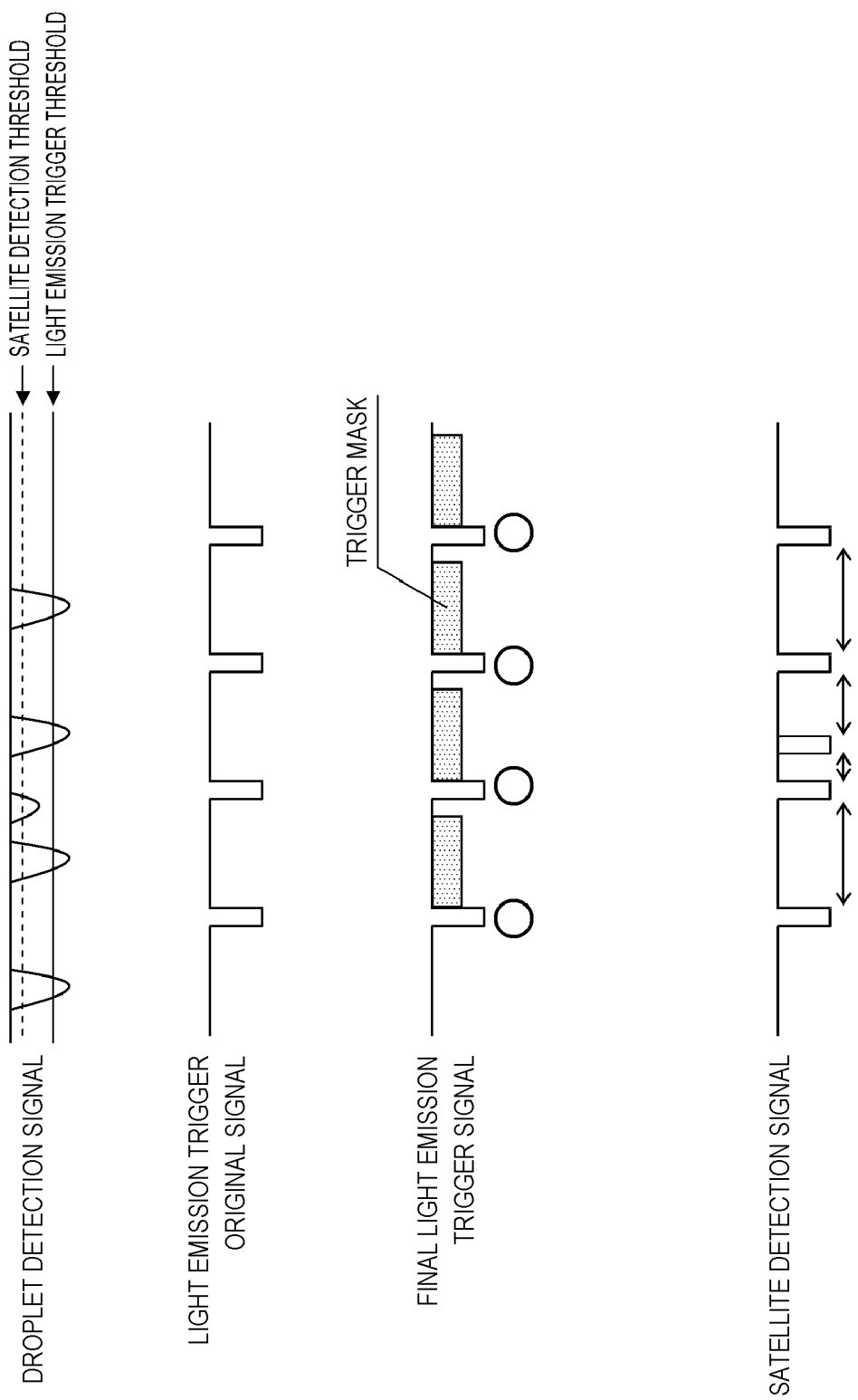
FIG. 6 illustrates an exemplary timing chart related to generation of a light emission trigger.

FIG. 6 is an exemplary timing chart related to generation of the light emission trigger. FIG. 6 illustrates examples of the droplet detection signal obtained from the droplet detection device, a light emission trigger original signal generated based on the droplet detection signal, a final light emission trigger signal, and a satellite detection signal. In FIG. 6, the horizontal axis represents time, and the vertical axis represents signal voltage.

The control unit 150 may receive the droplet detection signal from the droplet detection device 70. A light emission trigger threshold and a satellite detection threshold to be compared with the droplet detection signal may be set to the control unit 150. FIG. 6 illustrates an exemplary light emission trigger threshold and an exemplary satellite detection threshold together with an exemplary droplet detection signal.

In FIG. 6, the light emission trigger threshold and the satellite detection threshold are each set to be between lower limit at the average voltage value of the droplet detection signal at droplet passing and an upper limit at the average voltage value of a base line. The base line is the level of a signal from the optical sensor 78 when no droplet as a detection target exists.

The light emission trigger threshold is set to a detection level higher than that of the satellite detection threshold. Specifically, the light emission trigger threshold is set to a value farther separated from the base line than the satellite detection threshold.

The control unit 150 may generate the light emission trigger original signal based on the droplet detection signal exceeding the light emission trigger threshold. In FIG. 6, the droplet detection signal exceeding the light emission trigger threshold means the droplet detection signal having a voltage value smaller than the light emission trigger threshold.

Delay of the timing of the light emission trigger original signal from the timing of drop of the voltage of the droplet detection signal, which indicates droplet passing, includes a delay time due to a processing time that inevitably occurs at signal processing in the control unit 150.

When a drive signal that is square wave having a predetermined frequency is applied from the piezoelectric power source 96 described with reference to FIG. 3 to the piezoelectric element 65, tin droplets are continuously discharged from the nozzle 64. While falling, a plurality of the droplets discharged from the nozzle 64 are connected with each other, and then detected by the droplet detection device 70. A droplet formed when a plurality of droplets are normally connected with each other to have a necessary mass is also referred to as a "normal droplet".

When droplet connection is normal, the droplet detection signal obtained as the droplet has passed through the predetermined position P exceeds the light emission trigger threshold, and the normal droplet is detected. The detected normal droplet can be a target of irradiation with the pulse laser beam.

The control unit 150 may generate the final light emission trigger signal from the light emission trigger original signal.

The control unit 150 may perform masking of the light emission trigger for a certain time since a light emission trigger one trigger before (referred to as the "previous light emission trigger"). "Mask" is synonymous with "invalidation". The aspect of masking the light emission trigger may include stop of generation of pulses of the light emission trigger. In addition, the aspect of masking the light emission trigger may include generation of a signal that invalidates a light emission command function of the light emission trigger.

For example, the control unit 150 has a masking function to stop generation of the next light emission trigger for the certain time with respect to the previous light emission trigger as illustrated in FIG. 6. The masking function illustrated in FIG. 6 is referred to as "trigger mask", and the duration in which masking is performed is referred to as a mask duration.

In the line of pulses of the final light emission trigger signal illustrated in FIG. 6, the light emission trigger of pulses denoted by circles is transferred to the laser apparatus 13, and accordingly, each droplet corresponding to the light emission trigger is irradiated with the pulse laser beam.

FIG. 6 illustrates an exemplary satellite detection signal at the lowermost part. Because of defective droplet connection for some reason, the target supply unit 16 sometimes generates a connection defective droplet such as a satellite and a droplet having a volume smaller than a necessary volume. A satellite may be a form of a connection defective droplet.

The control unit 150 may generate the satellite detection signal based on the droplet detection signal exceeding the satellite detection threshold. In FIG. 6, the droplet detection signal exceeding the satellite detection threshold means the droplet detection signal having a voltage value smaller than the satellite detection threshold. The satellite detection signal may include a detection pulse corresponding to a normal droplet, and a detection pulse corresponding to a satellite.

The control unit 150 may perform droplet connection defect detection based on the satellite detection signal. The droplet connection defect detection may include determination of whether a droplet is a normal droplet or a connection defective droplet. The satellite detection signal is used to detect a droplet connection defect and does not necessarily need to be related to the light emission trigger.

6. Problem

Figure 7:
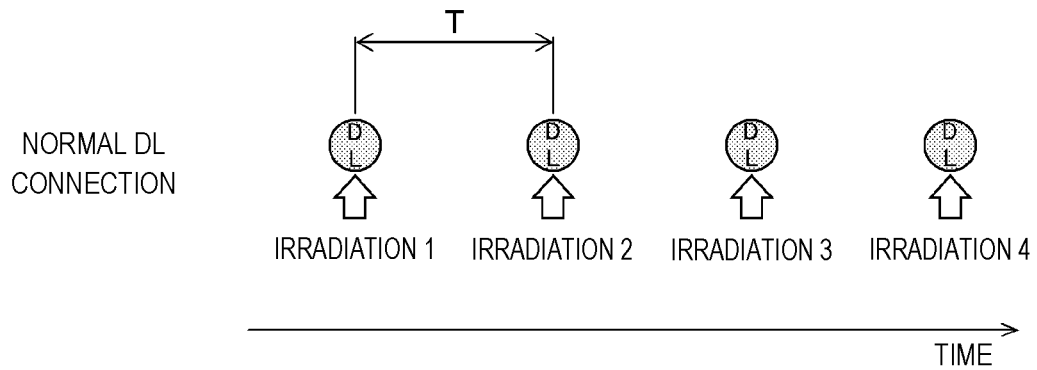
FIG. 7 is a diagram schematically illustrating the timing of pulse laser beam irradiation of each droplet obtained when droplet connection is normal.

FIG. 7 is a diagram schematically illustrating the timing of pulse laser beam irradiation of droplets obtained when droplet connection is normal. In FIG. 7, the horizontal axis represents time. In this example, the droplet generation frequency is 100 kHz, and droplets are irradiated with the pulse laser beam at 100 kHz. The droplet generation frequency is specified by the drive frequency of the piezoelectric element 65. The droplet generation period is the reciprocal of the droplet generation frequency. This droplet generation period TDL is 10 μs when the droplet generation frequency is 100 kHz.

The time interval of droplet supply to the plasma generation region 25 when droplet connection is normally performed is substantially equal to the droplet generation period TDL. The time interval of droplet supply to the plasma generation region 25 may be measured as the time interval T between detection pulses of the pass timing signal SA described with reference to FIG. 5. Droplets sequentially supplied to the plasma generation region 25 are irradiated with the pulse laser beam.

Figure 8:
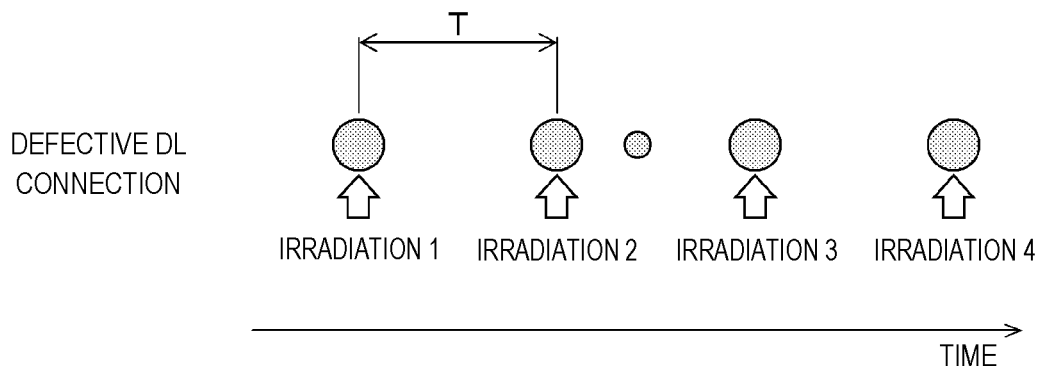
FIG. 8 is a diagram schematically illustrating exemplary control of laser beam irradiation of droplets when a droplet connection defect has occurred.

FIG. 8 is a diagram schematically illustrating exemplary control of laser beam irradiation of droplets when a droplet connection defect has occurred. FIG. 8 illustrates an example in which a satellite is generated between the second droplet and the third droplet from the left.

FIG. 8 corresponds to an example in which a laser beam is emitted from the laser apparatus 13 by using the "final light emission trigger signal" exemplarily illustrated in FIG. 6. As described with reference to FIG. 6, when a satellite is generated due to a droplet connection defect, the satellite is not irradiated with the pulse laser beam. However, since the light emission trigger is not invalidated for droplets before and after the satellite, the droplets before and after the satellite are irradiated with the pulse laser beam. At irradiation of the droplets before and after the satellite with the laser beam, the satellite nearby is scattered and becomes debris, which leads to contamination of the inside of the chamber 12 and the EUV condensation mirror 23.

In the case of FIG. 8, at irradiation of at least one of the second droplet and the third droplet with the laser beam, the satellite is scattered and may cause contamination inside the chamber 12.

Figure 9:
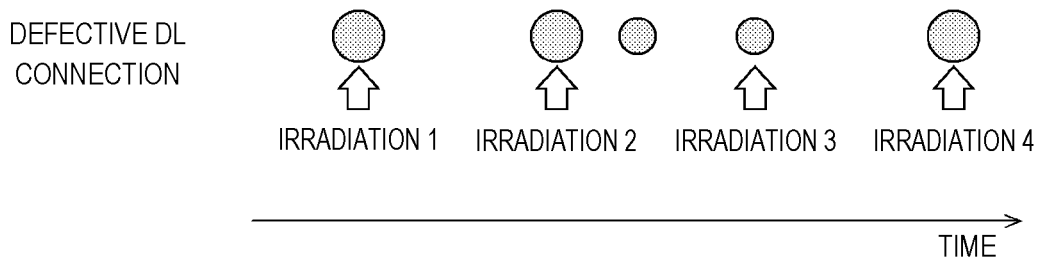
FIG. 9 is a diagram schematically illustrating another exemplary control of laser beam irradiation of droplets when a droplet connection defect has occurred.

FIG. 9 is a diagram schematically illustrating another exemplary control of laser beam irradiation of droplets when droplet connection defect has occurred. FIG. 9 illustrates an example in which the third droplet and the fourth droplet from the left each have become a droplet having a small volume due to a connection defect. Each droplet having a small volume has a volume with which the droplet is detected based on the light emission trigger threshold, and is a defective droplet having a volume smaller than the necessary volume of a normal droplet.

In this case, the third defective droplet from the left corresponds to the mask duration of the trigger mask since the light emission trigger for the second droplet, and thus is not irradiated with the laser beam. However, the fourth defective droplet from the left does not correspond to the mask duration, and thus is irradiated with the laser beam.

In the example illustrated in FIG. 9, the third defective droplet is scattered at irradiation of droplets before and after the defective droplet with the laser beam and may cause contamination inside the chamber 12. In addition, in the example illustrated in FIG. 9, the fourth defective droplet is irradiated with the laser beam, and thus generated EUV energy decreases, which leads to degradation of dose performance.

7. Embodiment 1

7.1 Configuration

An EUV light generation apparatus according to Embodiment 1 has a configuration same as that described with reference to FIGS. 1 to 3. The contents of light emission trigger generation control at the control unit 150 are different from those in the example described with reference to FIG. 6.

The difference will be described below.

7.2 Operation

An EUV light generation apparatus 10 according to Embodiment 1 can detect whether a connection defective droplet exists based on the satellite detection signal. Specifically, the control unit 150 detects a defective droplet based on the satellite detection signal.

The control unit 150 determines whether a connection defective droplet exists before or after a droplet as a laser beam irradiation target. The irradiation target droplet is irradiated with the laser beam only when no connection defective droplet exists before and after the irradiation target droplet.

The laser beam irradiation target may be a droplet detected as the droplet detection signal exceeding the light emission trigger threshold. The "connection defective droplet" may be a satellite or a droplet having a small volume.

Figure 10:
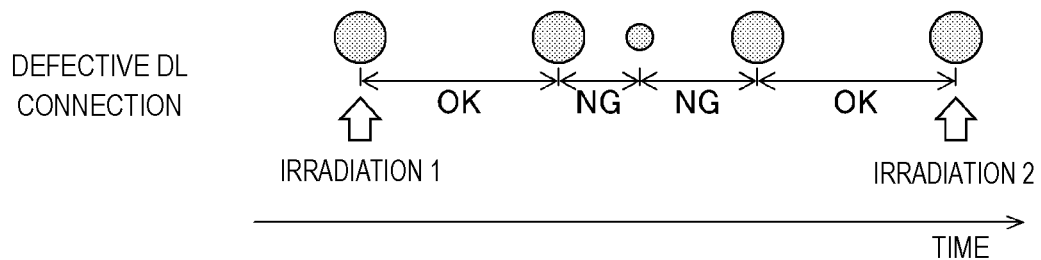
FIG. 10 is a diagram schematically illustrating exemplary control of laser beam irradiation achieved by an EUV light generation apparatus according to Embodiment 1.

FIG. 10 is a diagram schematically illustrating exemplary control of laser beam irradiation achieved by the EUV light generation apparatus according to Embodiment 1. FIG. 10 illustrates an example in which a satellite is generated.

As clearly understood from comparison between FIGS. 10 and 8, in the example illustrated in FIG. 10, laser beam irradiation is not performed for the satellite and is also stopped for the second droplet and the third droplet adjacent to the satellite.

The control unit 150 may generate the light emission trigger to emit the laser beam to a detected droplet, the distance of which to the preceding droplet one droplet before and the distance of which to the following droplet one droplet after are both in a defined allowable inter-DL distance range. The allowable inter-DL distance range may be determined in advance as a range from a minimum allowable inter-DL distance Xa to a maximum allowable inter-DL distance Xb of an inter-DL distance for which laser beam irradiation is allowed. The minimum allowable inter-DL distance Xa is the lower limit distance of the allowable inter-DL distance range. The maximum allowable inter-DL distance Xb is the upper limit distance of the allowable inter-DL distance range.

The minimum allowable inter-DL distance Xa may be set so that, when a droplet is irradiated with the laser beam, a satellite at a position separated from the droplet by the distance Xa or more is not scattered. The minimum allowable inter-DL distance Xa may be changed in accordance with the intensity of EUV light emission or the like.

The control unit 150 of the EUV light generation apparatus 10 according to Embodiment 1 has a function to stop laser beam irradiation of a droplet, an inter-DL distance of which measured based on the droplet detection signal is shorter than the minimum allowable inter-DL distance Xa. Specifically, when the inter-DL distance between droplets adjacent to each other is out of the allowable inter-DL distance range, the control unit 150 masks the light emission trigger so that the adjacent droplets are both not irradiated with the laser beam.

This masking of the light emission trigger to stop laser beam irradiation of a droplet out of the allowable inter-DL distance range with taken into account the inter-DL distance between droplets adjacent to each other is referred to as "DL interval trigger mask".

The term "DL interval" conceptually includes the distance between DLs and the time interval between DLs. The inter-DL distance can be converted into the DL time interval by using the droplet speed. The DL time interval can be inversely converted into the inter-DL distance by using the droplet speed. A defined allowable DL time interval range may be determined in place of the defined allowable inter-DL distance range. In the processing of calculation at the control unit 150, a numerical value indicating time may be used in place of a numerical value indicating distance.

In the example illustrated in FIG. 10, the inter-DL distance between the first droplet and the second droplet from the left is in the defined allowable inter-DL distance range, but the inter-DL distance between the second droplet and the third droplet (satellite) is out of the defined allowable inter-DL distance range. In addition, the inter-DL distance between the third droplet (satellite) and the fourth droplet is out of the defined allowable inter-DL distance range. The inter-DL distance between the fourth droplet and the fifth droplet is in the defined allowable inter-DL distance range.

In the example illustrated in FIG. 10, laser beam irradiation is stopped for each of the second droplet, the third droplet (satellite), and the fourth droplet. When the inter-DL distance between the fifth droplet and the sixth droplet (not illustrated) is in the defined allowable inter-DL distance range, the fifth droplet is irradiated with the laser beam.

Contamination inside the chamber 12 due to satellite scattering can be prevented by performing laser beam irradiation control as illustrated in FIG. 10.

Figure 11:
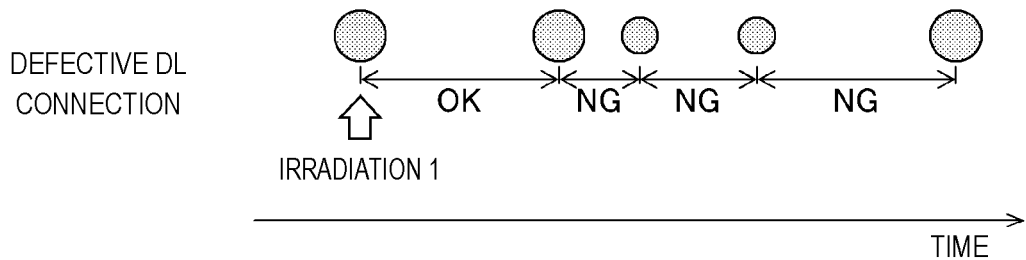
FIG. 11 is a diagram schematically illustrating exemplary control of laser beam irradiation achieved by the EUV light generation apparatus according to Embodiment 1.

FIG. 11 is a diagram schematically illustrating exemplary control of laser beam irradiation achieved by the EUV light generation apparatus according to Embodiment 1. FIG. 11 illustrates an example in which a plurality of defective droplets having small volumes are generated as connection defective droplets.

The control unit 150 determines whether a connection defective droplet exists before or after a droplet as a laser beam irradiation target. The irradiation target droplet is irradiated with the laser beam only when no connection defective droplet exists before and after the irradiation target droplet.

As clearly understood from comparison between FIGS. 11 and 9, in the example illustrated in FIG. 11, laser beam irradiation is not performed for the third defective droplet as a connection defective droplet, and laser beam irradiation is stopped for the second droplet adjacent to the defective droplet, the fourth defective droplet, and the fifth droplet.

In the example illustrated in FIG. 11, the inter-DL distance between the first droplet and the second droplet from the left is in the defined allowable inter-DL distance range, but the inter-DL distance between the second droplet and the third defective droplet is out of the defined allowable inter-DL distance range. In addition, the inter-DL distance between the third defective droplet and the fourth defective droplet is out of the defined allowable inter-DL distance range. The inter-DL distance between the fourth defective droplet and the fifth droplet is out of the defined allowable inter-DL distance range as well.

In the example illustrated in FIG. 11, laser beam irradiation is stopped for each of the second droplet, the third defective droplet, the fourth defective droplet, and the fifth droplet.

Contamination inside the chamber 12 due to defective droplet scattering can be prevented by performing laser beam irradiation control as illustrated in FIG. 11. In addition, degradation of dose performance can be prevented since laser irradiation for any defective droplet is stopped.

7.3 Margin of Delay Time from Droplet Detection to Laser Irradiation

7.3.1 Description of Total Delay Time

Figure 12:
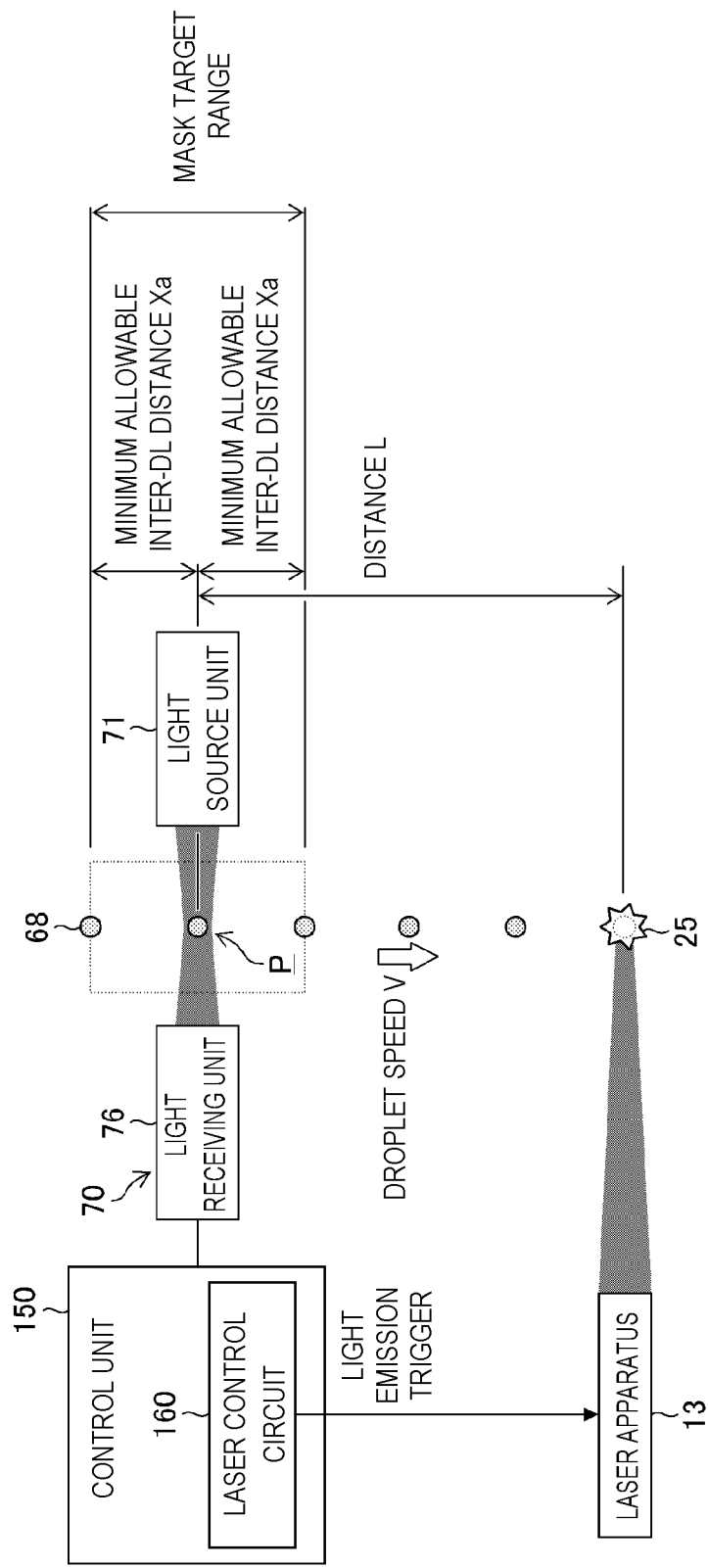
FIG. 12 is an explanatory diagram illustrating a margin of a delay time from droplet detection to laser irradiation.

FIG. 12 is an explanatory diagram illustrating a margin of the delay time from droplet detection to laser irradiation. Droplets are sequentially supplied from the target supply unit 16 toward the plasma generation region 25. The timing at which a droplet arrives at the plasma generation region 25 needs to be synchronized with the timing at which the droplet is irradiated with laser. Thus, the control unit 150 adjusts the delay time in the laser control circuit 160 when outputting the light emission trigger to the laser apparatus 13.

In the example illustrated in FIG. 12, the droplet generation frequency is 100 kHz. The distance from the position (predetermined position P) of droplet detection by the droplet detection device 70 to the plasma generation region 25 is represented by L, and the droplet speed is represented by V.

In this case, a time Td it takes for a droplet to arrive at the plasma generation region 25 after passing through the droplet detection position is given by Td=L/V. Thus, the control unit 150 adjusts the total delay time to Td.

For example, when the distance L is 4000 μm and the droplet speed V is 100 m/s, Td is 40 μs. The control unit 150 adjusts the total delay time to 40 μs.

The droplet speed V may be a moving average value of the speeds of sequentially generated droplets.

The distance L is longer than the inter-DL distance for one droplet generation period. The inter-DL distance for one droplet generation period is referred to as a standard inter-DL distance. The standard inter-DL distance is a typical inter-DL distance between normal droplets, which is calculated from the droplet generation frequency and the droplet speed. The distance L may be 2 to 10 times larger than the standard inter-DL distance. When the droplet generation frequency is 100 kHz and the droplet speed V is 100 m/s, the standard inter-DL distance is 1000 μm. The distance L is preferably 2000 μm to 10000 μm inclusive.

Synchronization of the droplet arrival timing and the laser beam irradiation timing in the plasma generation region 25 can be maintained by adjusting the total delay time to Td=L/V for each droplet as a laser beam irradiation target.

7.3.2 Description of Margin Time that Control Unit has

The above-described temporal margin of Td exists between detection of a droplet by the droplet detection device 70 and laser beam irradiation of the droplet.

When T1 represents a time taken for droplet detection processing, laser light emission, the processing time in the control unit 150, and the like in the EUV light generation apparatus 10, a margin time T_margin that the control unit 150 has in the example illustrated in FIG. 6 is given by T_margin=Td−T1.

TABLE 1

| Description | Delay time [μs] |
| --- | --- |
| DL detection, laser beam emission, processing time in control unit, etc. | T1 |

TABLE 1-continued

| Description | Delay time [us] |
|---|---|
| Margin time that control unit has | T_margin = Td − T1 |
| Total | Td |

In Embodiment 1, part of the margin time that the control unit 150 has is used as a delay time T_mask for the DL interval trigger mask.

When T1 represents a time taken for droplet detection processing, laser light emission, the processing time in the control unit 150, and the like in the EUV light generation apparatus 10, the margin time T_margin that the control unit 150 has in Embodiment 1 is given by T_margin=Td−(T1+T_mask).

TABLE 2

| Description | Delay time [us] |
|---|---|
| DL detection, laser beam emission, processing time in control unit, etc. | T1 |
| Delay time for DL interval trigger mask | T_mask |
| Margin time that control unit has | T_margin = Td − (T1 + T_mask) |
| Total | Td |

As indicated in Table 2, the total delay time Td is not different from the total delay time Td in the example indicated in Table 1, and thus synchronization of droplet arrival and laser irradiation in the plasma generation region 25 is maintained.

Thus, according to Embodiment 1, it is possible to achieve masking of the light emission trigger with the inter-DL distance to each of the preceding and following droplets taken into account while maintaining synchronization of the droplet arrival timing and the laser irradiation timing in the plasma generation region 25.

In FIG. 12, the minimum allowable inter-DL distance Xa is used to define a range within the distance Xa before and after a droplet as a mask target range of the DL interval trigger mask. As illustrated with a dashed line in FIG. 12, the mask target range of the DL interval trigger mask has a total width of 2×Xa. The minimum allowable inter-DL distance Xa may be set to be shorter than the standard inter-DL distance.

7.4 Example 1 of Laser Beam Irradiation Control 7.4.1 Operation

Figure 13:
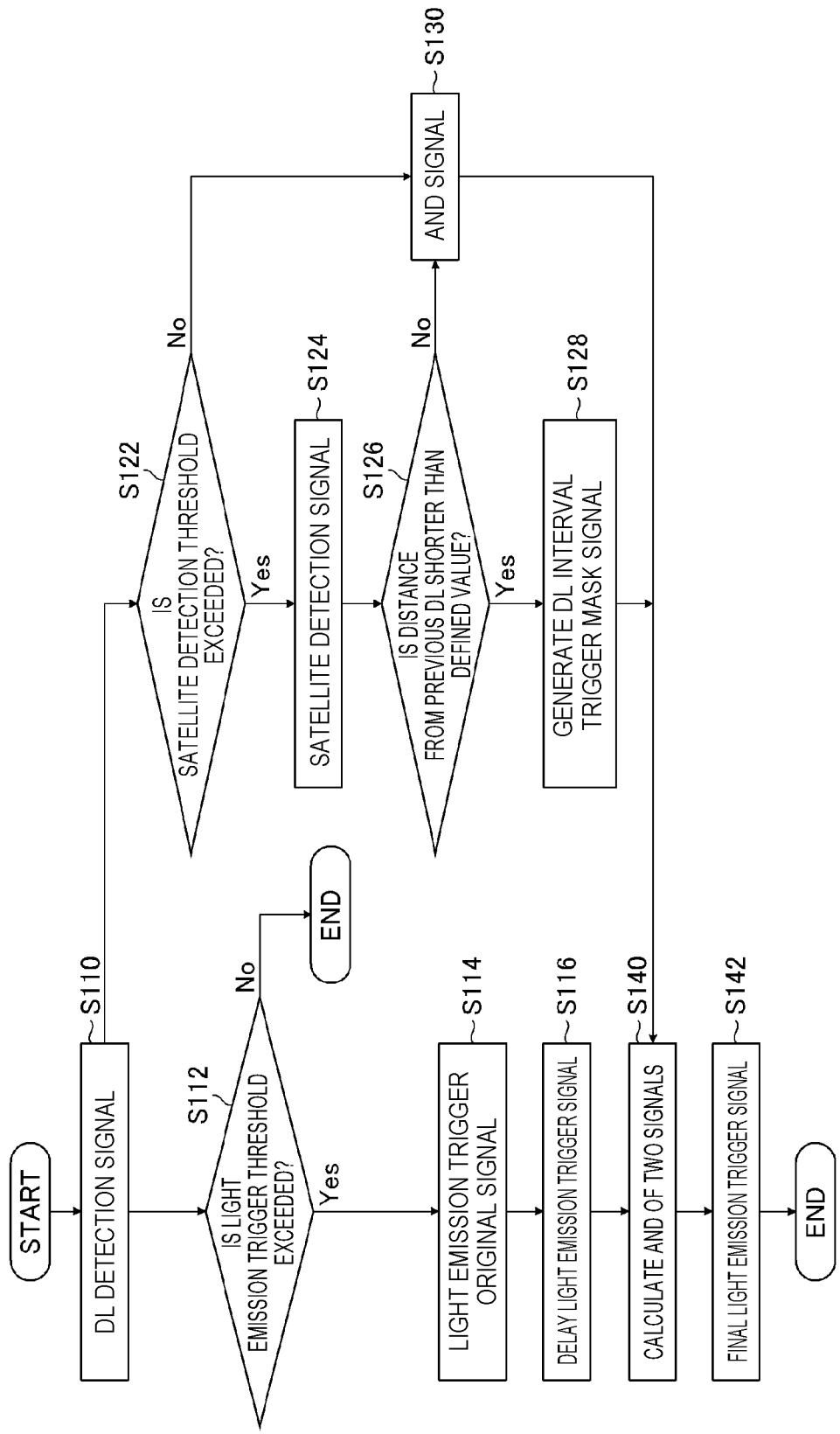
FIG. 13 is a flowchart illustrating an exemplary procedure of processing related to generation of the light emission trigger at the EUV light generation apparatus.

FIG. 13 is a flowchart illustrating an exemplary procedure of processing related to generation of the light emission trigger in the EUV light generation apparatus 10. At step S110, the control unit 150 receives the droplet detection signal from the droplet detection device 70. The control unit 150 bifurcates the droplet detection signal into two signals, and uses one of the signals in comparison with the light emission trigger threshold and the other signal in comparison with the satellite detection threshold.

At step S112, the control unit 150 determines whether the droplet detection signal exceeds the light emission trigger threshold. When the droplet detection signal does not exceed the light emission trigger threshold, the processing of the flowchart illustrated in FIG. 13 is ended.

Figure 14:
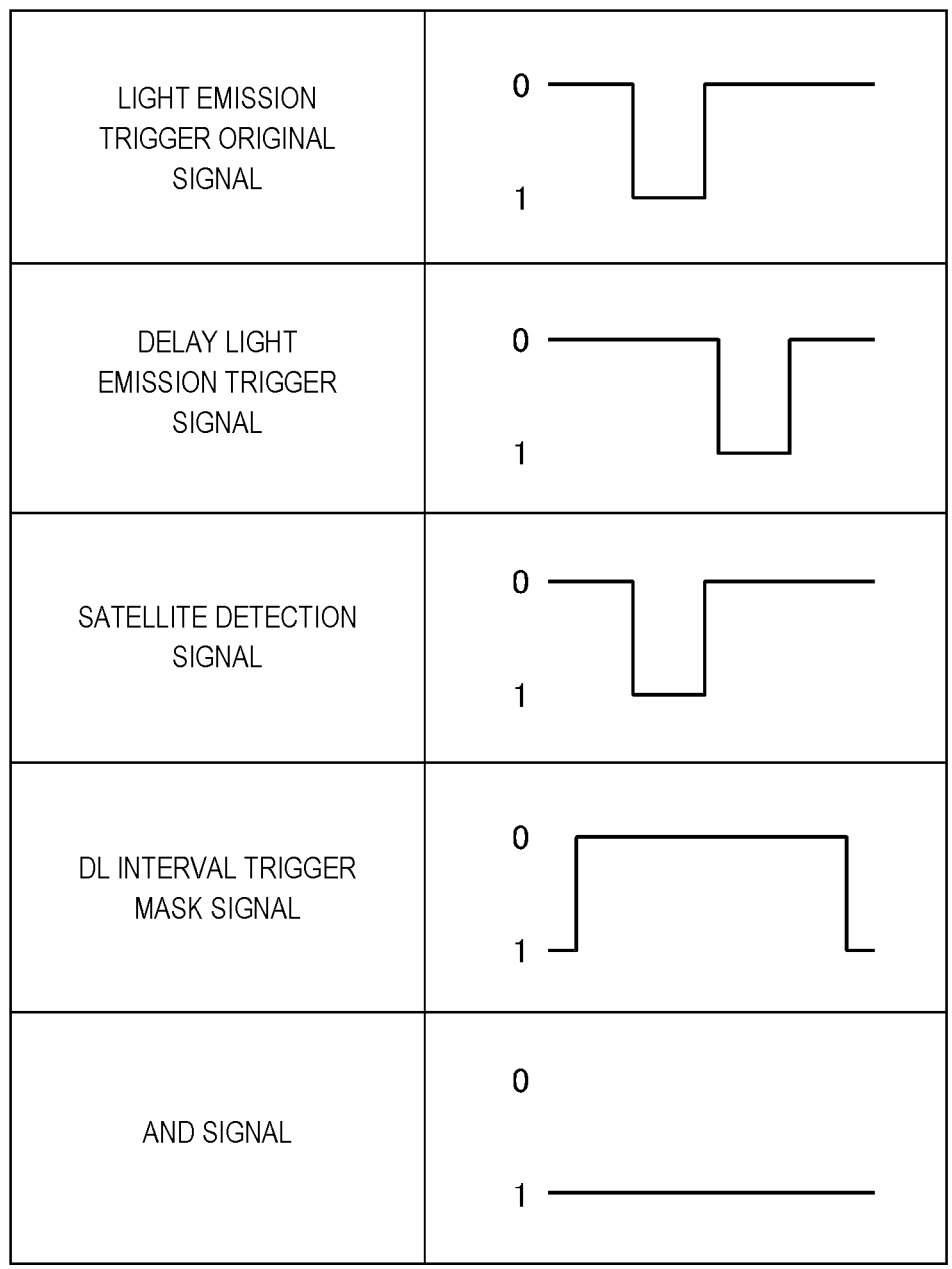
FIG. 14 is a diagram illustrating exemplary logic signals used for generation of the light emission trigger.

At step S112, when the droplet detection signal exceeds the light emission trigger threshold, the process proceeds to step S114 and the control unit 150 generates the light emission trigger original signal. For reference, FIG. 14 illustrates an exemplary light emission trigger original signal. The light emission trigger original signal may be a logic signal. FIG. 14 also illustrates exemplary signals of a delay light emission trigger signal, a satellite detection signal, a DL interval trigger mask signal, and an AND signal to be described later. These signals may be logic signals.

At step S116 in FIG. 13, the control unit 150 generates the delay light emission trigger signal by delaying the light emission trigger original signal by a predetermined delay time. The control unit 150 delays the light emission trigger original signal by a delay time necessary for the DL interval trigger mask. For example, the control unit 150 generates the delay light emission trigger signal by delaying the light emission trigger original signal by one droplet generation period. The delay time necessary for the DL interval trigger mask is not limited to one droplet generation period. The delay time necessary for the DL interval trigger mask may be shorter than one droplet generation period. After step S116, the process proceeds to step S140.

At step S122, the control unit 150 determines whether the droplet detection signal exceeds the satellite detection threshold.

At step S122, when the droplet detection signal exceeds the satellite detection threshold, the process proceeds to step S124. At step S124, the control unit 150 generates the satellite detection signal.

At step S126, the control unit 150 determines whether the distance from the previous droplet is shorter than a defined value based on the satellite detection signal. The distance from the previous droplet can be calculated from the product of the droplet speed and an elapsed time since the timing of a detection pulse upon detection of the previous droplet. The defined value used as a determination reference at step S126 may be the minimum allowable inter-DL distance Xa. The defined value used as the determination reference at step S126 is an exemplary "defined distance". The defined value may be changed in accordance with the droplet generation frequency, the laser frequency, and the pulse energy of EUV light.

When the determination at step S126 is positive, in other words, when the distance from the previous droplet is shorter than the defined value, the process proceeds to step S128. At step S128, the control unit 150 generates the DL interval trigger mask signal.

Specifically, at step S128, the control unit 150 generates "the DL interval trigger mask signal" as a mask signal of the DL interval trigger mask. The DL interval trigger mask signal may be what is called a Veto signal. The mask width indicating the time width of the DL interval trigger mask signal, in other words, the mask duration may be set to be a necessary value in accordance with an inter-DL distance for which laser beam irradiation is to be inhibited (masked).

When the determination at step S126 is negative, in other words, when the distance from the previous droplet is equal to or longer than the defined value, the process proceeds to step S130. At step S130, the control unit 150 generates the AND signal.

After step S128 or S130, the process proceeds to step S140.

At step S140, the control unit 150 calculates AND (logic product) of the two signals of any one of the DL interval trigger mask signal and the AND signal, and the delay light emission trigger signal obtained at step S116.

After the processing at step S140, the control unit 150 generates the final light emission trigger at step S142.

7.4.2 Effect

With exemplary control illustrated in the flowchart in FIG. 13, it is possible to achieve the DL interval trigger mask and prevent contamination inside the chamber.

7.4.3 Modification 1

At step S126 in FIG. 13, distance may be converted into time. A conversion formula is as follows.

time=distance/droplet speed

7.5 Example 2 of Laser Beam Irradiation Control

7.5.1 Operation

Figure 15:
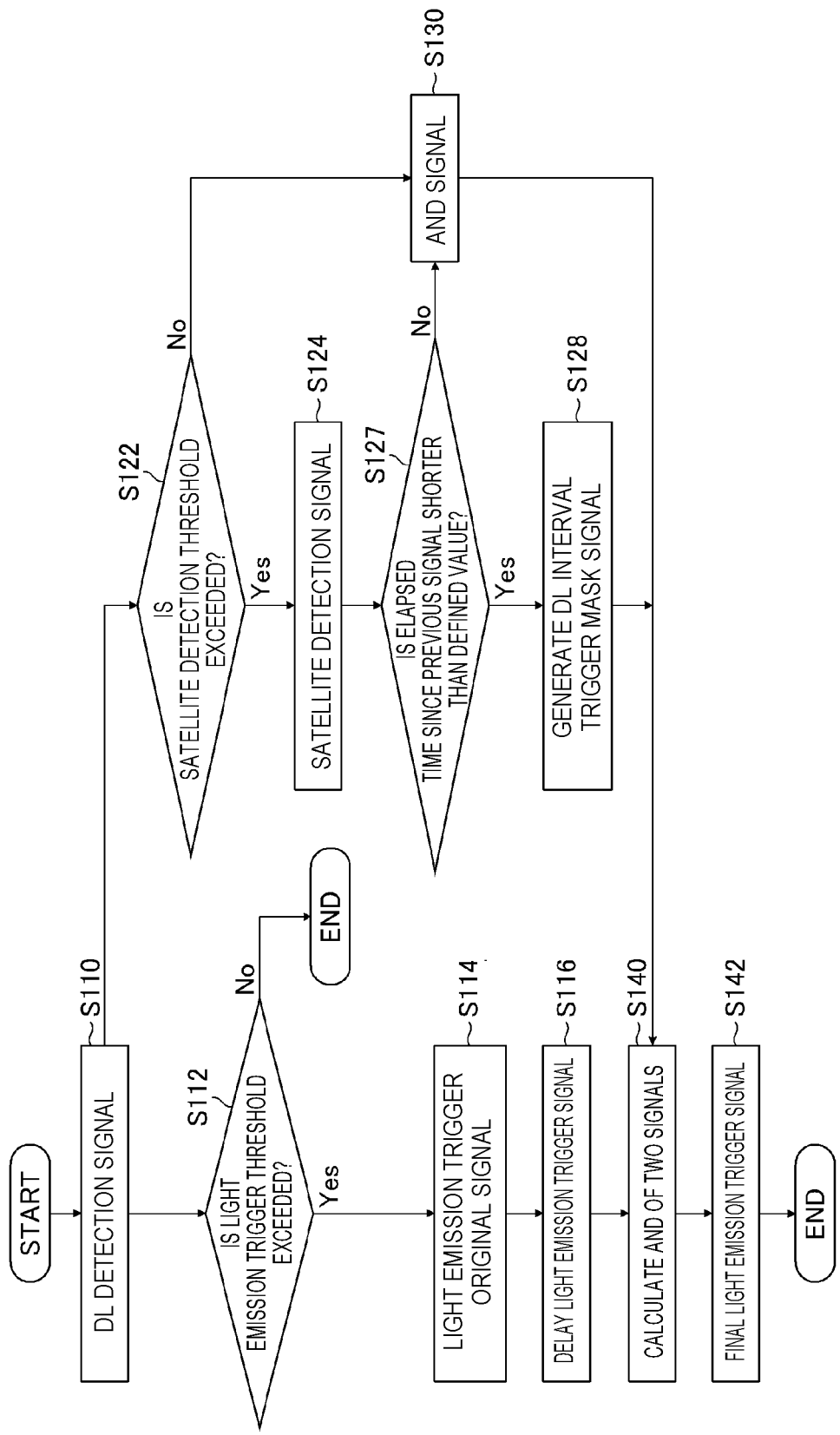
FIG. 15 is a flowchart illustrating another exemplary procedure of processing related to generation of the light emission trigger at the EUV light generation apparatus.

FIG. 15 is a flowchart illustrating another exemplary procedure of processing related to generation of the light emission trigger in the EUV light generation apparatus 10. In FIG. 15, a step identical to that in the example described with reference to FIG. 13 is denoted by an identical step number, and description thereof will be omitted. The following describes difference from FIG. 13.

The flowchart illustrated in FIG. 15 includes step S127 in place of step S126 in FIG. 13.

At step S127, the control unit 150 determines whether an elapsed time since a signal before determination of whether the distance from the previous droplet is shorter than the defined value is shorter than a defined value based on the satellite detection signal. The "signal before" is the previous detection pulse in the sequential order of the line of pulses of the satellite detection signal. The defined value used as the determination reference at step S127 may be a minimum allowable DL time interval obtained by converting the minimum allowable inter-DL distance Xa into time. The defined value used as the determination reference at step S127 is an exemplary "defined time".

7.5.2 Effect

With exemplary control according to the flowchart illustrated in FIG. 15, it is possible to achieve the DL interval trigger mask and prevent contamination inside the chamber.

7.5.3 Modification 2

At step S127 in FIG. 15, time may be converted into distance. A conversion formula is as follows.

distance=droplet speed×time

7.6 Example 3 of Laser Beam Irradiation Control

7.6.1 Operation

Figure 16:
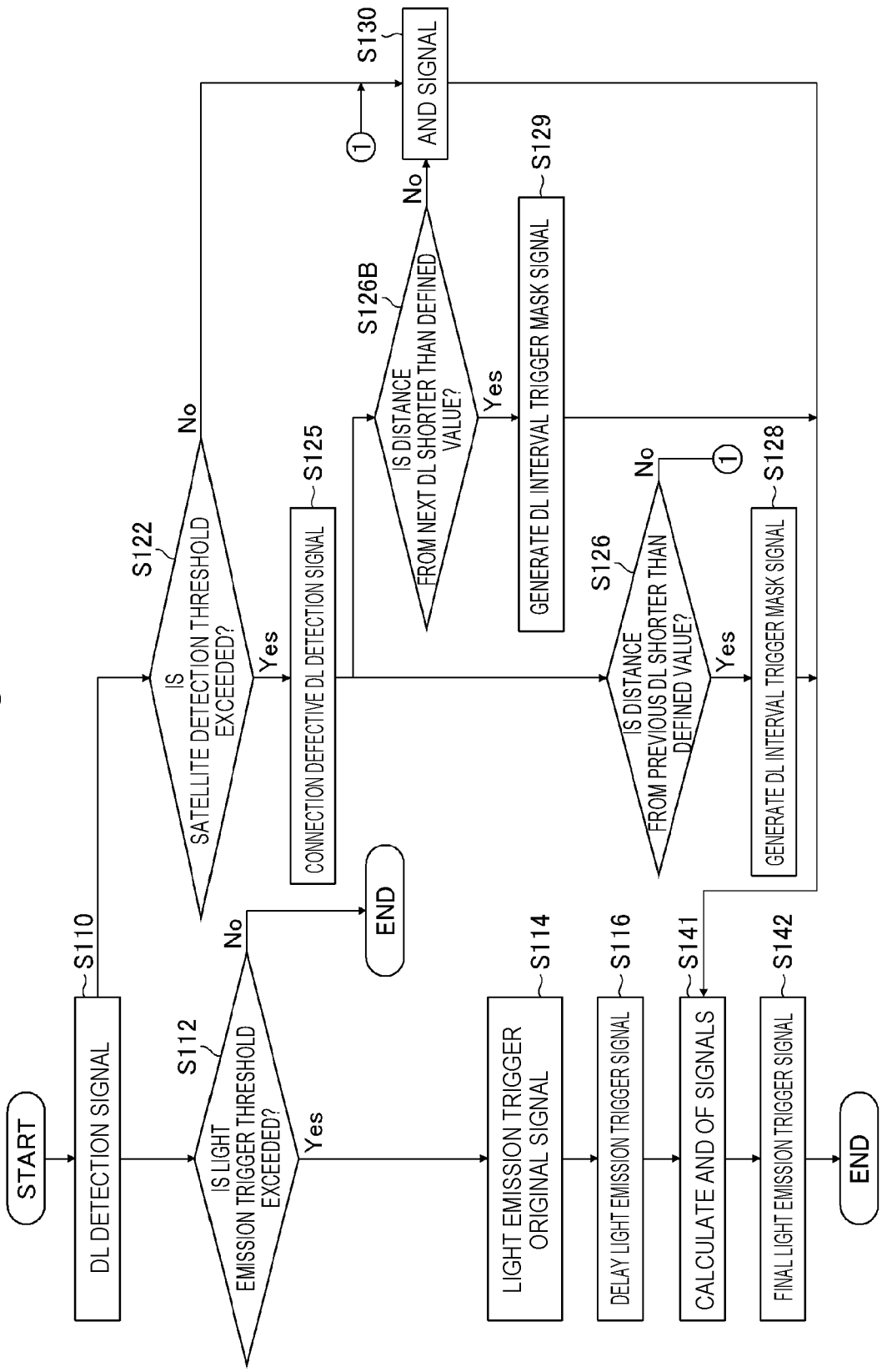
FIG. 16 is a flowchart illustrating another exemplary procedure of processing related to generation of the light emission trigger at the EUV light generation apparatus.

FIG. 16 is a flowchart illustrating an exemplary procedure of processing related to generation of the light emission trigger in the EUV light generation apparatus 10. In FIG. 16, a step identical to that in the example described with reference to FIG. 13 is denoted by an identical step number, and description thereof will be omitted. The following describes difference from FIG. 13.

The flowchart illustrated in FIG. 16 includes step S125 in place of step S124 in FIG. 13. The flowchart illustrated in FIG. 16 also includes steps S126B and S129 bifurcating from step S125.

In addition, the flowchart illustrated in FIG. 16 includes step S141 in place of step S140 in FIG. 13.

At step S125, the control unit 150 generates a connection defect DL detection signal. The connection defect DL detection signal may be same as the satellite detection signal.

At step S126B, the control unit 150 determines whether the distance from the following droplet is shorter than a defined value based on the connection defect DL detection signal. The distance from the following droplet can be calculated from the product of the droplet speed and an elapsed time until the timing of a detection pulse upon detection of the following droplet. The defined value used as the determination reference at step S126B may be the minimum allowable inter-DL distance Xa.

When the determination at step S126B is positive, in other words, when the distance from the following droplet is shorter than the defined value, the process proceeds to step S129. At step S129, the control unit 150 generates the DL interval trigger mask signal.

When the determination at step S126B is negative, in other words, when the distance from the following droplet is equal to or longer than the defined value, the process proceeds to step S130. At step S130, the control unit 150 generates the AND signal.

Through the processing at steps S122 to S130, at least one of the DL interval trigger mask signal and the AND signal may be generated. The control unit 150 may generate both the DL interval trigger mask signal and the AND signal.

After steps S128 and S129 or after step S130, the process proceeds to step S141.

At step S141, the control unit 150 calculates AND (logic product) of the delay light emission trigger signal and at least one of the DL interval trigger mask signal and the AND signal.

After the processing at step S141, the control unit 150 generates the final light emission trigger at step S142.

7.6.2 Effect

With exemplary control according to the flowchart illustrated in FIG. 16, it is possible to achieve the DL interval trigger mask and prevent contamination inside the chamber.

Figure 17:
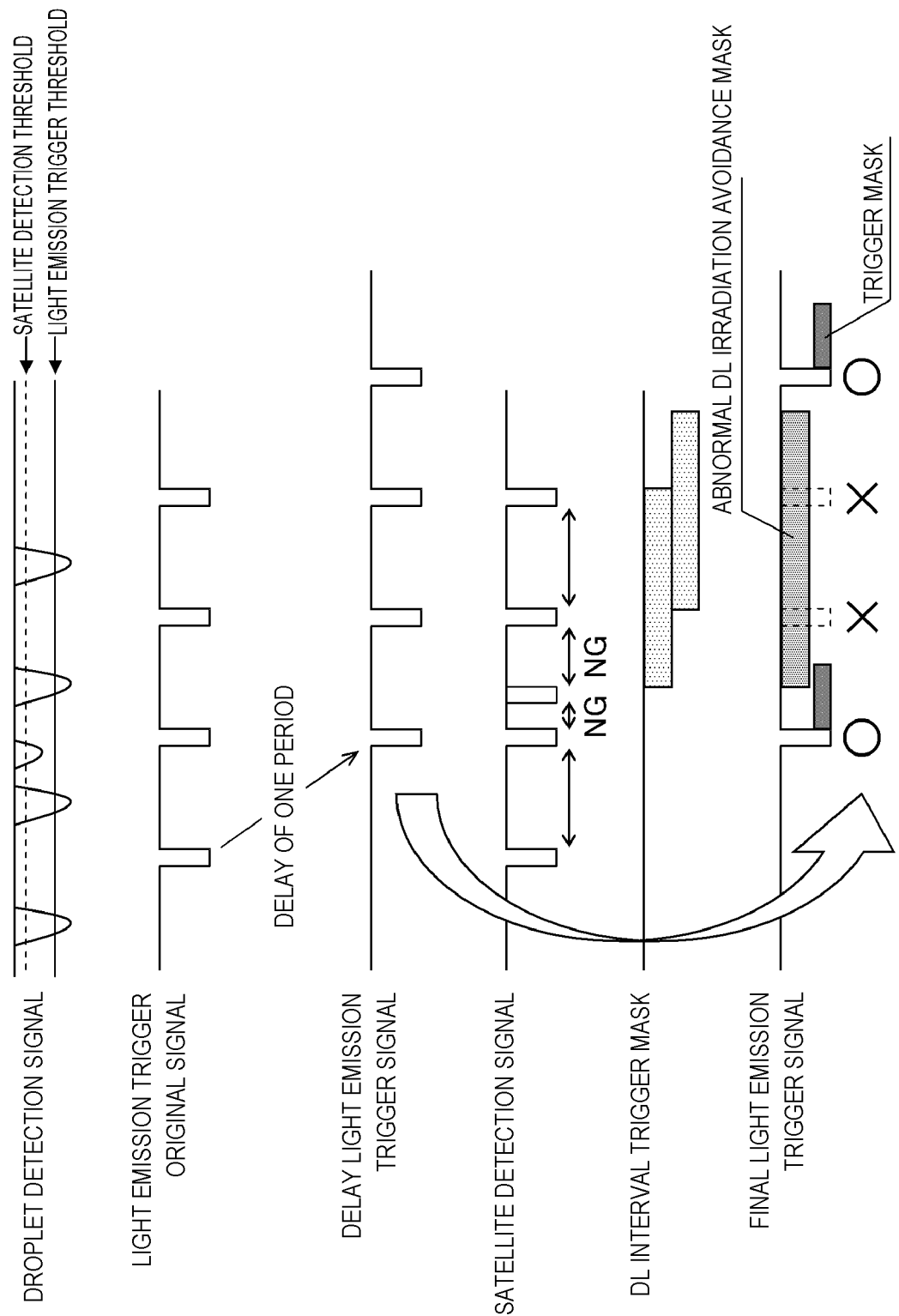
FIG. 17 is a timing chart illustrating exemplary laser beam irradiation timing control.

7.7 Timing Chart Illustrating Exemplary Laser Beam Irradiation Timing Control FIG. 17 is a timing chart illustrating exemplary laser beam irradiation timing control. In this example, as described with reference to FIG. 12, the repetition frequency of pulse oscillation of the laser apparatus 13 is 100 kHz, the droplet generation frequency is 100 kHz, and the droplet speed is 100 m/s. In this case, the droplet generation period is 10 μs, and the standard inter-DL distance is 1000 μm.

The processing of generating the light emission trigger original signal and the satellite detection signal from the droplet detection signal is same as that in the example described with reference to FIG. 6. The following describes difference of the example illustrated in FIG. 17 from that illustrated in FIG. 6.

The control unit 150 generates the delay light emission trigger signal by delaying the light emission trigger original signal. In the example illustrated in FIG. 17, the delay light emission trigger signal is generated by delaying the light emission trigger original signal by one droplet generation period. The amount of delay is not limited to one droplet generation period but may be changed to, in accordance with an inter-DL distance for which masking is to be performed, an appropriate delay time in the margin time that the control unit 150 has.

The control unit 150 generates, from the satellite detection signal, the DL interval trigger mask for invalidating the light emission trigger. The control unit 150 generates the DL interval trigger mask based on the satellite detection signal when the DL interval is shorter than a defined value. In the example illustrated in FIG. 17, the time interval between the second detection pulse and the third detection pulse from the left in the satellite detection signal is shorter than the defined value. Thus, the DL interval trigger mask is generated with respect to the second detection pulse. In addition, the time interval between the third detection pulse and the fourth detection pulse from the left in the satellite detection signal is shorter than the defined value. Thus, the DL interval trigger mask is generated with respect to the third detection pulse.

The mask time width of the generated DL interval trigger mask may be changed in accordance with the inter-DL distance for which masking is to be performed. The inter-DL distance for which masking is to be performed may be changed in accordance with the intensity of EUV light emission or the like. For example, the inter-DL distance for which masking is to be performed may be set to be a distance with which, when a droplet is irradiated with the laser beam, a satellite nearby is not scattered. The inter-DL distance for which masking is to be performed may be set to be equal to or longer than the minimum allowable inter-DL distance Xa.

In the example illustrated in FIG. 12, the inter-DL distance for which masking with the DL interval trigger mask is to be performed is set to be the minimum allowable inter-DL distance Xa. The minimum allowable inter-DL distance Xa may be set to be shorter than the distance for one droplet generation period.

In the example illustrated in FIG. 12, a mask target range extends forward and backward from a droplet by the minimum allowable inter-DL distance Xa. As illustrated in FIG. 12, when the minimum allowable inter-DL distance Xa is substantially equal to the distance for one droplet generation period, the range of one droplet generation period needs to be reliably masked by the DL interval trigger mask.

In this case, the control unit 150 generates, as the DL interval trigger mask signal, a mask signal (the DL interval trigger mask signal) having a mask time width larger than one droplet generation period and smaller than two droplet generation periods. In the example illustrated in FIG. 17, the mask time width of the DL interval trigger mask is larger than 10 μs and smaller than 20 μs. For example, the mask time width of the DL interval trigger mask is preferably 12 μs to 18 μs inclusive.

The mask time width of the DL interval trigger mask signal is preferably larger than Txa and smaller than 2×Txa, where Txa represents the minimum allowable DL time interval determined by the minimum allowable inter-DL distance Xa and the droplet speed. When the generated mask signal satisfies the condition "Txa<the mask time width<2× Txa", laser beam irradiation of each droplet in the distance range of the minimum allowable inter-DL distance Xa is stopped.

The final light emission trigger signal is generated by calculating AND (logic product) of the DL interval trigger mask signal thus generated and the delay light emission trigger signal.

As illustrated in the lowermost part of FIG. 17, the first pulse from the left in the delay light emission trigger signal is included in the light emission trigger of the final light emission trigger signal. The second pulse and the third pulse from the left in the delay light emission trigger signal are masked by the DL interval trigger mask and do not remain in the final light emission trigger signal. The fourth pulse from the left in the delay light emission trigger signal is included in the light emission trigger of the final light emission trigger signal.

As a result, laser beam irradiation is stopped for a satellite as a defective droplet and the preceding and following droplets before and after the defective droplet as described with reference to FIG. 10. Specifically, as illustrated in FIG. 17, the whole (logical sum) of the DL interval trigger mask signal generated based on the satellite detection signal may function as an abnormal DL irradiation avoidance mask that avoids laser beam irradiation of a defective droplet and any droplet in a certain region before and after the defective droplet. As illustrated in FIG. 17, the control unit 150 may generate the trigger mask described with reference to FIG. 6 in addition to the DL interval trigger mask.

8. Embodiment 2

8.1 Configuration

An EUV light generation apparatus according to Embodiment 2 has a configuration same as that described with reference to FIGS. 1 to 3. The contents of light emission trigger generation control at the control unit 150 are different from those in the example described with reference to FIG. 6 and Embodiment 1. The difference will be described below.

8.2 Operation

In the EUV light generation apparatus according to Embodiment 2, the repetition frequency of pulse oscillation of the laser apparatus 13 is 50 kHz, the droplet generation frequency is 50 kHz, and the droplet speed is 100 m/s. In this case, the droplet generation period is 20 μs, and the standard inter-DL distance is 2000 μm.

Figure 18:
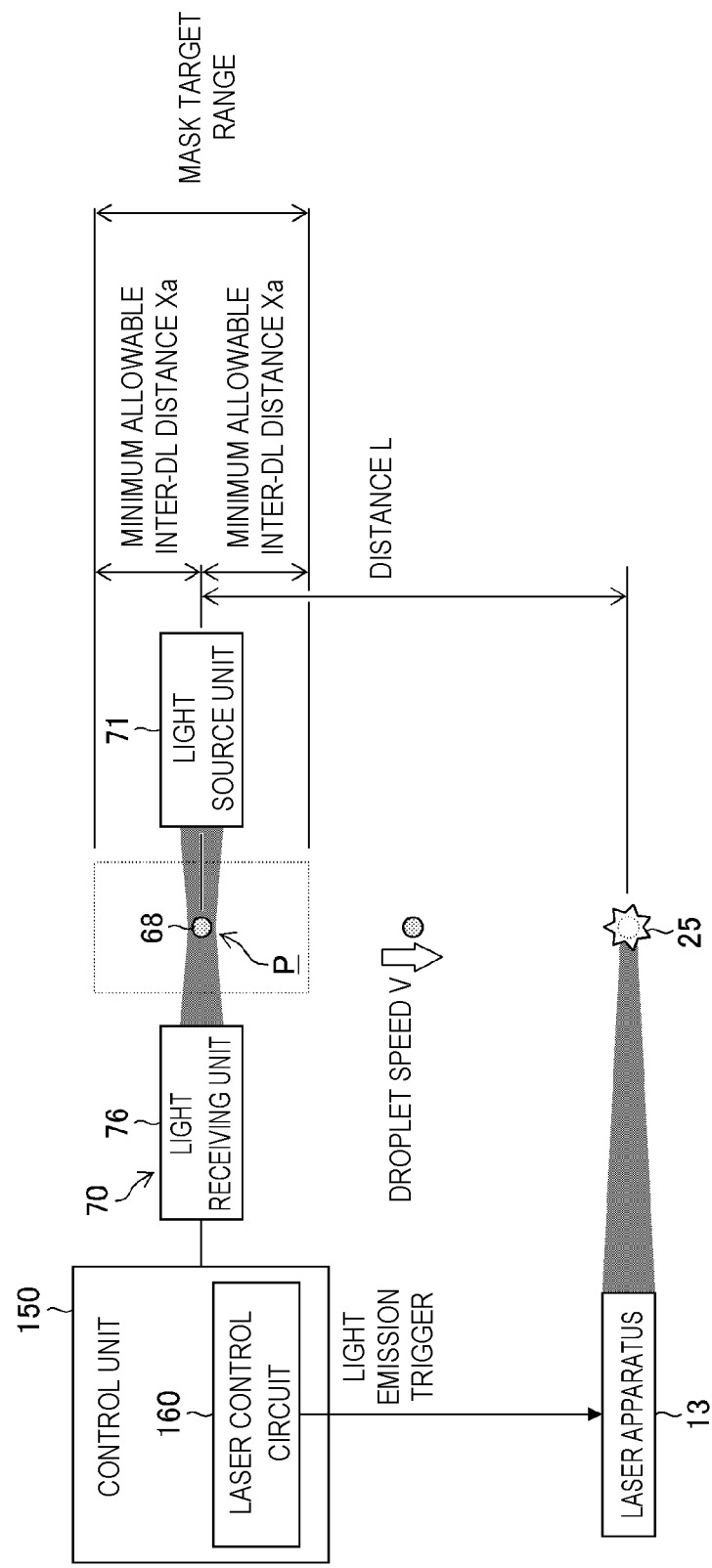
FIG. 18 is an explanatory diagram illustrating the margin of the delay time from droplet detection to laser irradiation in an EUV light generation apparatus according to Embodiment 2.

FIG. 18 is an explanatory diagram illustrating the margin of the delay time from droplet detection to laser irradiation. When the distance L from the droplet detection position (predetermined position P) to the plasma generation region 25 is 4000 μm, the time Td it takes for a droplet to arrive at the plasma generation region 25 after passing through the predetermined position P is given by Td=L/V=40 μs. Thus, the control unit 150 adjusts the total delay time to 40 μs. Accordingly, synchronization of the droplet arrival timing and the laser irradiation timing in the plasma generation region 25 can be maintained.

When the pulse energy of EUV light is not changed from that in the example of Embodiment 1, the size of the mask target range of the DL interval trigger mask, which is achieved by the DL interval trigger mask, is same as that in Embodiment 1. Specifically, the mask target range of the DL interval trigger mask is the range of the distance Xa before and after a droplet. The minimum allowable inter-DL distance Xa may be, for example, 500 μm to 2000 μm inclusive.

Figure 19:
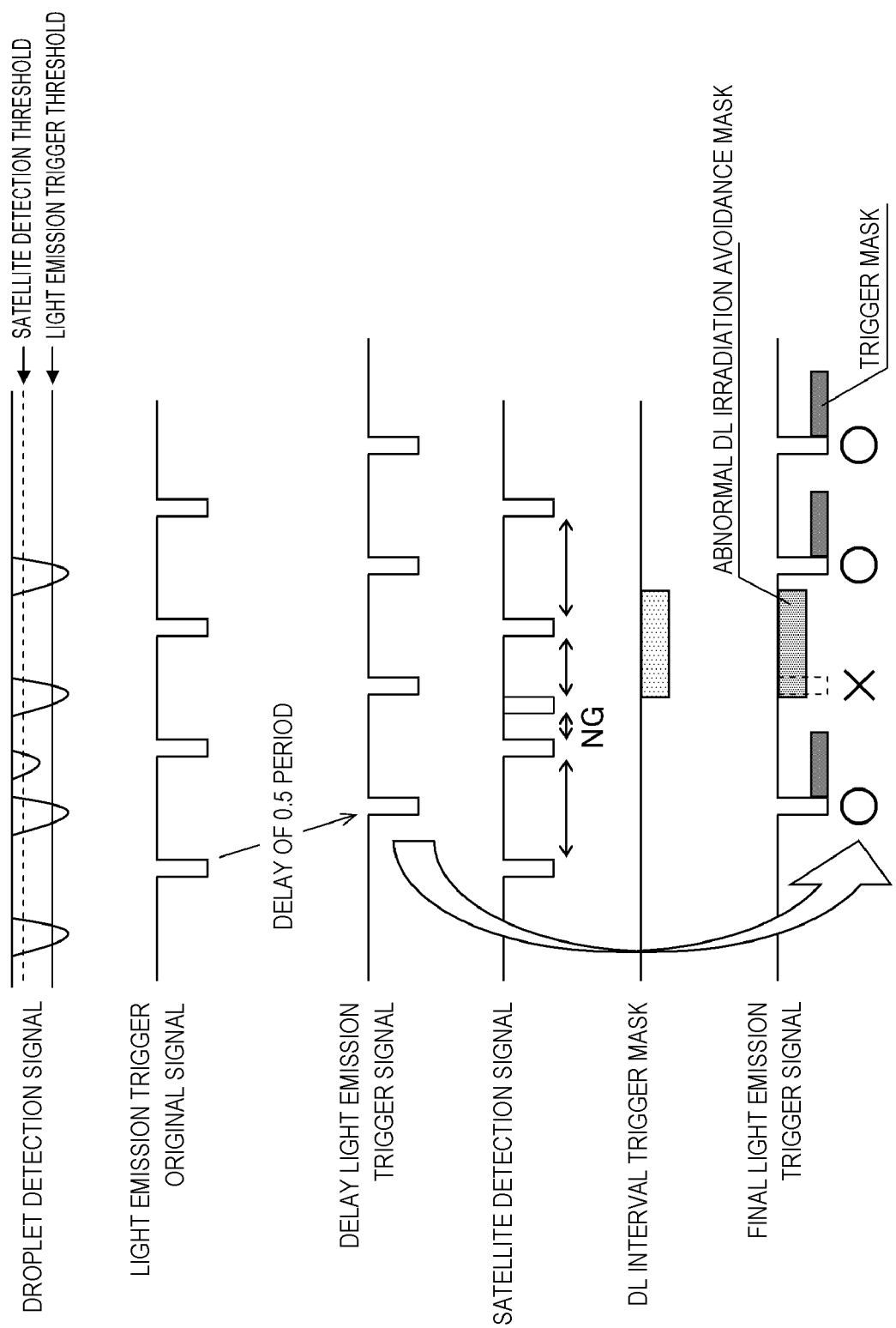
FIG. 19 is a timing chart illustrating exemplary laser beam irradiation timing control in Embodiment 2.

8.3 Timing Chart Illustrating Exemplary Laser Beam Irradiation Timing Control FIG. 19 is a timing chart illustrating exemplary laser beam irradiation timing control in Embodiment 2. For the EUV light generation apparatus according to Embodiment 2, the droplet generation period is 20 μs, and the standard inter-DL distance is 2000 μm.

The processing of generating the light emission trigger original signal and the satellite detection signal from the droplet detection signal is same as that in the example described with reference to FIG. 6. The following describes difference of the example illustrated in FIG. 19 from that in FIG. 17.

The control unit 150 generates the delay light emission trigger signal by delaying the light emission trigger original signal. In the example illustrated in FIG. 19, the delay light emission trigger signal is generated by delaying the light emission trigger original signal by 0.5 droplet generation period. The amount of delay is not limited to 0.5 droplet generation period but may be changed to, in accordance with the inter-DL distance for which masking is to be performed, an appropriate delay time in the margin time that the control unit 150 has.

The control unit 150 generates, from the satellite detection signal, the DL interval trigger mask invalidating the light emission trigger. The control unit 150 generates the DL interval trigger mask based on the satellite detection signal when the DL interval is shorter than a defined value. In the example illustrated in FIG. 19, the time interval between the second detection pulse and the third detection pulse from the left in the satellite detection signal is shorter than the defined value. Thus, the DL interval trigger mask is generated with respect to the second detection pulse.

In the example illustrated in FIG. 19, the mask target range of the DL interval trigger mask extends forward and backward from a droplet by 0.5 droplet generation period. In this case, the range of 0.5 droplet generation period needs to be reliably masked by the DL interval trigger mask. Thus, the control unit 150 generates, as the DL interval trigger mask signal, a signal having a mask time width larger than 0.5 droplet generation period and smaller than one droplet generation period. In the example illustrated in FIG. 19, the mask time width of the DL interval trigger mask is larger than 10 μs and smaller than 20 μs. For example, the mask time width of the DL interval trigger mask is preferably 12 μs to 18 μs inclusive.

The final light emission trigger signal is generated by calculating AND (logic product) of the DL interval trigger mask thus generated and the delay light emission trigger signal.

As illustrated in the lowermost part of FIG. 19, the first pulse from the left in the delay light emission trigger signal is included in the light emission trigger of the final light emission trigger signal. The second pulse from the left in the delay light emission trigger signal is masked by the DL interval trigger mask and does not remain in the final light emission trigger signal. The third pulse and the fourth pulse from the left in the delay light emission trigger signal are included in the light emission trigger of the final light emission trigger signal.

As a result, laser beam irradiation is stopped for the preceding droplet of a defective droplet, the inter-DL distance of which is shorter than the minimum allowable inter-DL distance Xa. Laser beam irradiation may be performed for the following droplet of a defective droplet, the inter-DL distance of which is equal to or longer than the minimum allowable inter-DL distance Xa.

8.4 Effect

According to Embodiment 2, similarly to Embodiment 1, it is possible to achieve the DL interval trigger mask and prevent contamination inside the chamber.

Figure 20:
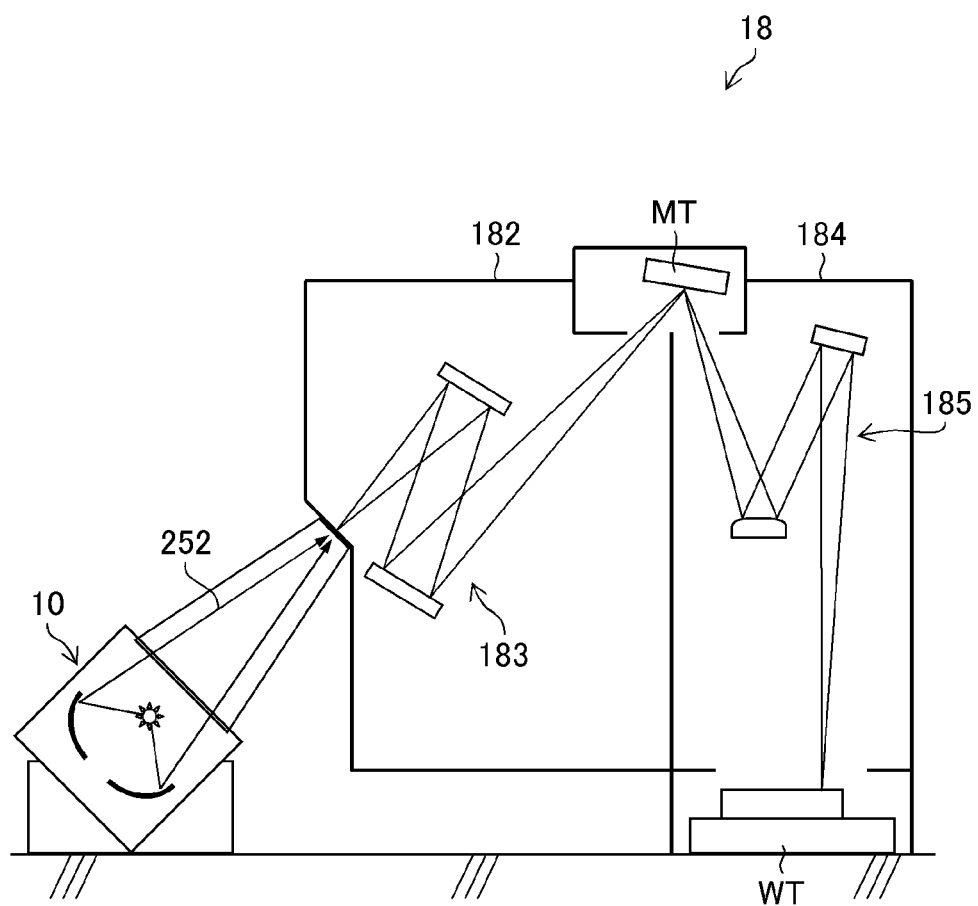
FIG. 20 is a diagram illustrating a schematic configuration of an exposure apparatus connected with the EUV light generation apparatus.

9. Exemplary Electronic Device Manufacturing Method Using EUV Light Generation Apparatus FIG. 20 is a diagram illustrating a schematic configuration of the exposure apparatus connected with the EUV light generation apparatus. In FIG. 20, the exposure apparatus 18 includes a mask irradiation unit 182 and a workpiece irradiation unit 184. The mask irradiation unit 182 illuminates a mask pattern on a mask table MT with the EUV light 252 incident from the EUV light generation apparatus 10 through a reflected optical system 183.

The workpiece irradiation unit 184 images the EUV light 252 reflected by the mask table MT onto a workpiece (not illustrated) disposed on a workpiece table WT through a reflected optical system 185.

The workpiece is a photosensitive substrate such as a semiconductor wafer on which photoresist is applied. The exposure apparatus 18 moves the mask table MT and the workpiece table WT in parallel to each other in synchronization to expose the workpiece to the EUV light reflected by the mask pattern.

A semiconductor device can be manufactured by transferring a device pattern onto the semiconductor wafer through the above-described exposure process. The semiconductor device is an exemplary electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus that generates plasma by irradiating a target substance with a pulse laser beam and generates extreme ultraviolet light from the plasma, the extreme ultraviolet light generation apparatus comprising:
   a chamber housing a plasma generation region in which the pulse laser beam is incident;
   a target supply unit configured to sequentially supply droplets of the target substance to the plasma generation region in the chamber;
   a droplet detection unit configured to detect the droplets output from the target supply unit and passing through a predetermined position between the target supply unit and the plasma generation region; and
   a control unit configured to control a laser apparatus configured to output the pulse laser beam,
   the control unit being configured to perform control to determine whether there is a defective droplet based on a droplet detection signal obtained from the droplet detection unit and to stop, when it is determined that there is a defective droplet, irradiation of the defective droplet, a preceding droplet output one droplet before the defective droplet, and a following droplet output one droplet after the defective droplet with the pulse laser beam.

2. The extreme ultraviolet light generation apparatus according to claim 1, wherein the control unit generates a mask signal that stops irradiation with the pulse laser beam.

3. The extreme ultraviolet light generation apparatus according to claim 1, wherein the control unit determines whether there is a defective droplet based on a time interval of the droplet detection signals obtained from the droplet detection unit.

4. The extreme ultraviolet light generation apparatus according to claim 1, wherein a distance from the predetermined position at which the droplet detection unit observes passing of the droplet to the plasma generation region is longer than a standard inter-droplet distance for one period of a droplet generation period, the standard inter-droplet distance being determined by a speed of the droplet and the droplet generation period.

5. The extreme ultraviolet light generation apparatus according to claim 4, wherein the distance from the predetermined position at which the droplet detection unit observes passing of the droplet to the plasma generation region is 2000 µm to 10000 µm inclusive.

6. An electronic device manufacturing method comprising:
generating extreme ultraviolet light by using the extreme ultraviolet light generation apparatus according to claim 1;
outputting the extreme ultraviolet light to an exposure apparatus; and
exposing a photosensitive substrate to the extreme ultraviolet light in the exposure apparatus to manufacture an electronic device.

7. An extreme ultraviolet light generation apparatus that generates plasma by irradiating a target substance with a pulse laser beam and generates extreme ultraviolet light from the plasma, the extreme ultraviolet light generation apparatus comprising:
a chamber housing a plasma generation region in which the pulse laser beam is incident;
a target supply unit configured to sequentially supply droplets of the target substance to the plasma generation region in the chamber;
a droplet detection unit configured to detect the droplets output from the target supply unit and passing through a predetermined position between the target supply unit and the plasma generation region; and
a control unit configured to control a laser apparatus configured to output the pulse laser beam,
the control unit being configured to perform control to calculate an inter-droplet distance of the droplet based on a droplet detection signal obtained from the droplet detection unit and to stop, when the inter-droplet distance is shorter than a predetermined defined distance, irradiation of each of the droplets adjacent to each other at the inter-droplet distance shorter than the defined distance with the pulse laser beam.

8. The extreme ultraviolet light generation apparatus according to claim 7, wherein a distance from the predetermined position at which the droplet detection unit observes passing of the droplet to the plasma generation region is longer than a standard inter-droplet distance for one period of a droplet generation period, the standard inter-droplet distance being determined by a speed of the droplet and the droplet generation period.

9. The extreme ultraviolet light generation apparatus according to claim 7, wherein the control unit performs control
to determine whether there is a defective droplet based on a droplet detection signal obtained from the droplet detection unit, and
to stop, when the inter-droplet distance between a defective droplet determined to be defective by the determination and an adjacent droplet that is adjacent to the defective droplet is shorter than the defined distance, irradiation of the defective droplet and the adjacent droplet as the droplets adjacent to each other with the pulse laser beam.

10. The extreme ultraviolet light generation apparatus according to claim 9, wherein the control unit calculates a time interval of the droplets passing through the predetermined position based on the droplet detection signal obtained from the droplet detection unit and determines whether there is a defective droplet based on the time interval.

11. The extreme ultraviolet light generation apparatus according to claim 7, wherein the control unit generates a mask signal that stops irradiation with the pulse laser beam.

12. The extreme ultraviolet light generation apparatus according to claim 11, wherein
a mask time width of the mask signal is longer than Txa and shorter than 2×Txa, where Txa represents a minimum allowable droplet time interval determined by a minimum allowable inter-droplet distance as a lower limit of an inter-droplet distance at which irradiation with the pulse laser beam is allowed and a speed of the droplet.

13. The extreme ultraviolet light generation apparatus according to claim 7, wherein a minimum allowable inter-droplet distance as a lower limit of an inter-droplet distance at which irradiation with the pulse laser beam is allowed is shorter than a standard inter-droplet distance for one period of a droplet generation period, the standard inter-droplet distance being determined by a speed of the droplet and the droplet generation period.

14. The extreme ultraviolet light generation apparatus according to claim 7, wherein a minimum allowable inter-droplet distance as a lower limit of an inter-droplet distance at which irradiation with the pulse laser beam is allowed is 500 µm to 2000 µm inclusive.

15. The extreme ultraviolet light generation apparatus according to claim 7, wherein the control unit generates a mask signal that stops irradiation with the pulse laser beam.

16. The extreme ultraviolet light generation apparatus according to claim 7, wherein a distance from the predetermined position as a position of droplet detection by the droplet detection unit to the plasma generation region is longer than a standard inter-droplet distance for one period of a droplet generation period, the standard inter-droplet distance being determined by a speed of the droplet and the droplet generation period.

17. The extreme ultraviolet light generation apparatus according to claim 7, wherein a distance from the predetermined position as a position of droplet detection by the droplet detection unit to the plasma generation region is 2000 µm to 10000 µm inclusive.

18. An electronic device manufacturing method comprising:

generating extreme ultraviolet light by using the extreme ultraviolet light generation apparatus according to claim 7;

outputting the extreme ultraviolet light to an exposure apparatus; and exposing a photosensitive substrate to the extreme ultraviolet light in the exposure apparatus to manufacture an electronic device.

19. An extreme ultraviolet light generation apparatus that generates plasma by irradiating a target substance with a pulse laser beam and generates extreme ultraviolet light from the plasma, the extreme ultraviolet light generation apparatus comprising:

a chamber housing a plasma generation region in which the pulse laser beam is incident;

a target supply unit configured to sequentially supply droplets of the target substance to the plasma generation region in the chamber;

a droplet detection unit configured to detect the droplets output from the target supply unit and passing through a predetermined position between the target supply unit and the plasma generation region; and a control unit configured to control a laser apparatus configured to output the pulse laser beam, the control unit being configured to perform control to calculate a time interval of the droplets passing through the predetermined position based on a droplet detection signal obtained from the droplet detection unit and to stop, when the time interval of the droplets is shorter than a predetermined defined time, irradiation of each of droplets adjacent to each other at the time interval shorter than the defined time with the pulse laser beam.

20. An electronic device manufacturing method comprising:

generating extreme ultraviolet light by using the extreme ultraviolet light generation apparatus according to claim 19;

outputting the extreme ultraviolet light to an exposure apparatus; and exposing a photosensitive substrate to the extreme ultraviolet light in the exposure apparatus to manufacture an electronic device.

\* \* \* \* \*